(12) United States Patent
Shimada

(10) Patent No.: US 12,392,819 B2
(45) Date of Patent: Aug. 19, 2025

(54) SEMICONDUCTOR DEVICE

(71) Applicant: RENESAS ELECTRONICS CORPORATION, Tokyo (JP)

(72) Inventor: Kazuki Shimada, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 131 days.

(21) Appl. No.: 18/062,257

(22) Filed: Dec. 6, 2022

(65) Prior Publication Data

US 2023/0204657 A1    Jun. 29, 2023

(30) Foreign Application Priority Data

Dec. 28, 2021 (JP) .................................. 2021-214600

(51) Int. Cl.
| | |
|---|---|
| G01R 31/28 | (2006.01) |
| G01R 31/00 | (2006.01) |
| H02H 1/00 | (2006.01) |
| H02H 9/04 | (2006.01) |
| H10D 89/60 | (2025.01) |

(52) U.S. Cl.
CPC ....... G01R 31/2879 (2013.01); H02H 1/0007 (2013.01); H02H 9/046 (2013.01); H10D 89/601 (2025.01); G01R 31/002 (2013.01)

(58) Field of Classification Search
CPC .............. G01R 31/2879; G01R 31/002; H01L 27/0251; H02H 1/0007; H02H 9/046
See application file for complete search history.

(56) References Cited

U.S. PATENT DOCUMENTS

| | | | |
|---|---|---|---|
| 8,519,929 B2 * | 8/2013 | Umezaki | G09G 3/3648 345/94 |
| 10,361,665 B2 * | 7/2019 | Matsuno | H03F 1/565 |
| 11,114,849 B2 * | 9/2021 | Narita | H01L 27/0285 |

(Continued)

FOREIGN PATENT DOCUMENTS

| | | |
|---|---|---|
| EP | 3 249 417 A2 | 11/2017 |
| JP | 2008-124572 A | 5/2008 |
| WO | 2013175959 A1 | 11/2013 |

OTHER PUBLICATIONS

A. Patnaik; et al., "On-Chip sensors to measure level of transient events," [online], 2017, 39th Electrical Overstress / Electrostatic Discharge Symposium (EOS/ESD).

(Continued)

*Primary Examiner* — Reena Aurora
(74) *Attorney, Agent, or Firm* — Rimon P.C.

(57) ABSTRACT

According to one embodiment, a semiconductor device includes: a potential supply terminal to which a potential is supplied; a terminal (I/O terminal) for exchanging a signal with an outside; an I/O current detection load circuit electrically connected to the potential supply terminal and the terminal; and a current sensor circuit detecting the I/O current flowing through the I/O current detection load circuit. The current sensor circuit acquires a sensor current proportional to the I/O current and outputs the acquired sensor current as output information, and the I/O current is an abnormal current flowing through the I/O terminal due to at least one of electrostatic discharge and electromagnetic susceptibility and is a current that is greater than a predetermined current and that causes an abnormal state.

19 Claims, 21 Drawing Sheets

(56) References Cited

U.S. PATENT DOCUMENTS

2008/0106453 A1   5/2008   Hotta et al.
2015/0124137 A1   5/2015   Sato et al.
2016/0285255 A1   9/2016   O'Donnell et al.

OTHER PUBLICATIONS

Notice of Reasons for Refusal issued in corresponding Japanese Application No. 2021-214600, dated Mar. 4, 2025.

* cited by examiner

SEMICONDUCTOR DEVICE

CROSS-REFERENCE TO RELATED APPLICATION

The present application claims priority from Japanese Patent Application No. 2021-214600 filed on Dec. 28, 2011, the content of which is hereby incorporated by reference into this application.

BACKGROUND

The present invention relates to a semiconductor device.

For example, healthcare products having terminals that come into direct contact with the human body, industrial motor products and industrial sensor products in which cables are long and loud noise is generated, and in-vehicle products that emphasize safety more than ever due to autonomous driving, and the like demand strict noise immunity for mounted ICs from the viewpoint of functional safety and safety. This is disclosed in, for example, Patent Document 1 (EP 3249417 A1) and Non-Patent Document 1 (A. Patnaik; M. Suchak; R. Seva; K. Pamidimukkala; G. Edgingt on NXP Semiconductors, Austin, Tex.; R. Moseley; J. Feddeler; M. Stockinger; D. Beetner, "On-Chip sensors to measure level of transient events", [online], 2017, 39th Electrical Overstress/Electrostatic Discharge Symposium (EOS/ESD), [search on Nov. 17, 2021], Internet, <https:// ieeexplore. ieee. Org/document/8073459>).

SUMMARY

These noises are called electrostatic discharge ESD (Electro Static Discharge) or electromagnetic susceptibility EMS (Electromagnetic Susceptibility), and pass a noise current through the ICs from an input/output terminal (I/O terminal) for exchanging a signal with an outside of a substrate mounting the ICs. The noise current is also called an I/O current.

The noise current (I/O current) is larger than a current flowing during a normal operation of the IC, and is such a current that the IC becomes an abnormal state such as destruction or malfunction of the IC, which brings large loss about safeness of the products mounting the ICs. Therefore, by detecting the noise current (I/O current) generated by these ESD and EMS in the IC, the IC's abnormal states such as IC destruction and malfunction are detected and warned, or can use a function of improving robustness against the IC destruction and the malfunction based on a detection result(s), which ensures product's safeness against the noise currents such as ESD and EMS. Therefore, it is desired to improve detection accuracy and measurement accuracy of this noise current (I/O current).

Other problems and novel features will be apparent from the description of the present specification and the accompanying drawings.

According to one embodiment, a semiconductor device includes: a potential supply terminal to which a potential is supplied; an I/O terminal for exchanging a signal with an outside; an I/O current detection load circuit electrically connected to the potential supply terminal and the I/O terminal; and a current sensor circuit detecting an I/O current flowing through the I/O current detection load circuit, and the current sensor circuit acquires a sensor current proportional to the I/O current, and outputs the acquired sensor current as output information. A current flowing through the I/O current detection load circuit is the same as the noise current and the I/O current.

According to the above-mentioned embodiment, provided can be the semiconductor device capable of improving the detection accuracy and the measurement accuracy of this noise current.

DETAILED DESCRIPTION

Figure 1:
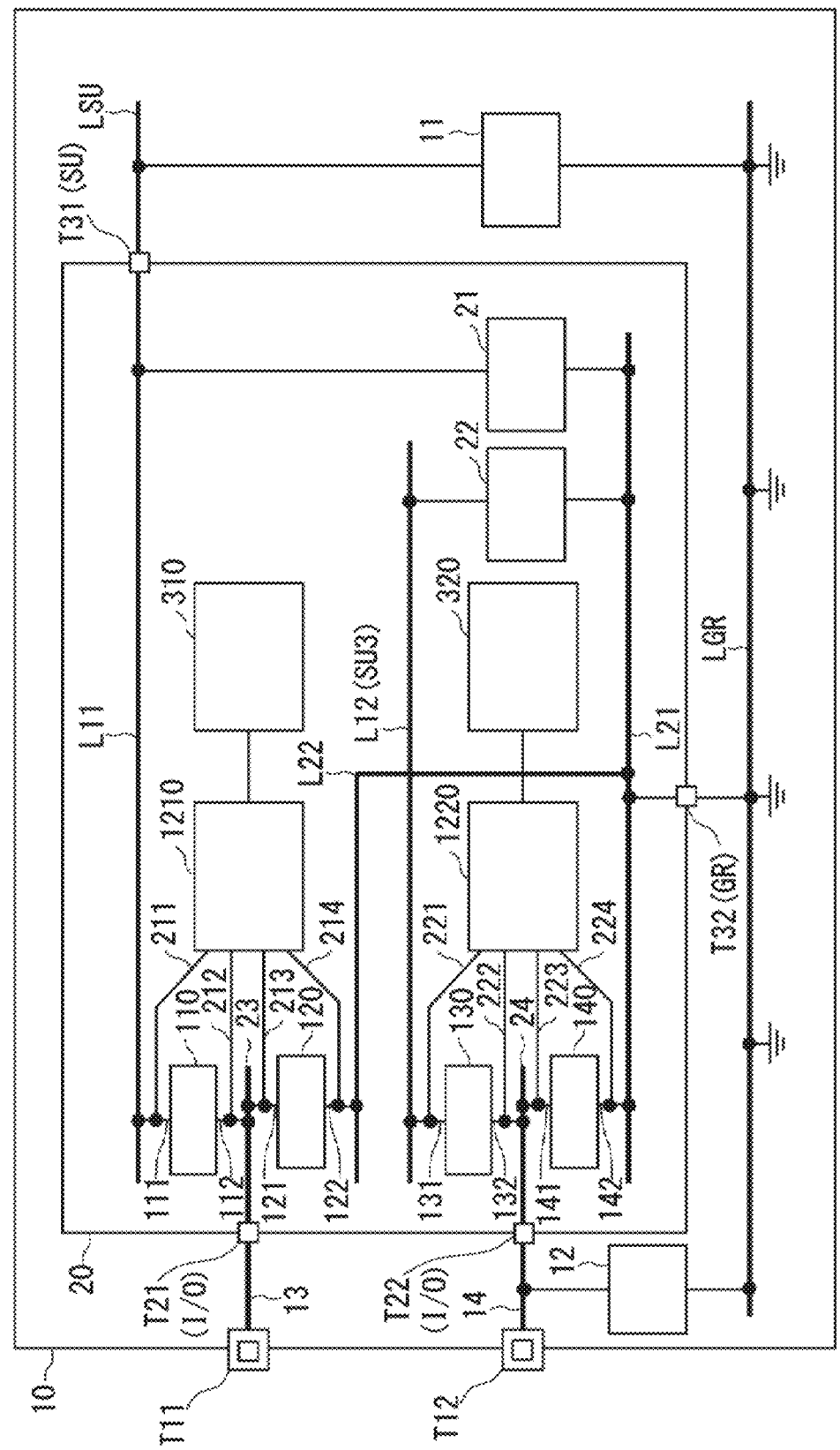
FIG. 1 is a configuration diagram illustrating a semiconductor device according to a comparative example.

For clarity of explanation, the following descriptions and drawings are omitted and simplified as appropriate. Further, in each drawing, the same elements are denoted by the same reference numerals, and an overlapping description will be omitted as necessary.

Prior to the description of a semiconductor device according to an embodiment, a semiconductor device according to a comparative example and problems will be described. This makes a semiconductor device according to an embodiment clearer. Incidentally, the semiconductor device according to the comparative example is also included within a technical idea of the embodiment.

COMPARATIVE EXAMPLE

FIG. 1 is a configuration diagram illustrating a semiconductor device according to a comparative example. As shown in FIG. 1, a semiconductor device 1001 according to a comparative example has a substrate 10. Terminals T11, T12, an IC (Integrated Circuit) 20, a potential supply wiring LSU, a ground wiring LGR, substrate load circuits 11, 12, signal lines 13, 14 are formed on the substrate 10. Incidentally, some wirings, signal lines, and circuits may further be formed on the substrate 10.

The terminal T11 is, for example, an input/output terminal (I/O terminal) described above, and is a terminal for exchanging a signal(s) with an outside. The Input/output terminal is also called an I/O terminal. The terminal T11 is connected to a signal line 13. The terminal T12 is, for example, an input/output terminal (I/O terminal) described above, and is a terminal for exchanging a signal(s) with an outside. The terminal T12 is connected to a signal line 14. The potential supply wiring LSU is connected to a potential supply source. Therefore, a predetermined potential is supplied to the potential supply wiring LSU. The predetermined potential is called a first potential. The predetermined potential is, for example, a power supply potential. The ground wiring LGR is connected to the ground. Therefore, a ground potential (grounding potential) different from the first potential is supplied to the ground wiring LGR. The ground potential is called a second potential. The ground potential may be 0 V, for example.

The substrate load circuit 11 is electrically connected to the potential supply wiring LSU and the ground wiring LGR. That is, one terminal of the substrate load circuit 11 is connected to the potential supply wiring LSU, and the other terminal is connected to the ground wiring LGR. The substrate load circuit 12 is electrically connected to the signal line 14 and the ground line LGR. That is, one terminal of the substrate load circuit 12 is connected to the signal line 14, and the other terminal is connected to the ground wiring LGR. The substrate load circuit 11 and the substrate load circuit 12 are predetermined circuits formed on the substrate 10.

The IC 20 includes an I/O current detection load circuit 110, an I/O current detection load circuit 120, an I/O current detection load circuit 130, an I/O current detection load circuit 140, a current sensor circuit 1210, a current sensor circuit 1220, an information processing circuit 310, an information processing circuit 320, a power supply load circuit 21, a power supply load circuit 22, a signal line 23, a signal line 24, a terminal T21, a terminal T22, a terminal T31, a terminal T32, a wiring L11, a wiring L12, a wiring L21, and a wiring L22. Incidentally, the IC 20 may further include several wirings, signal lines, and circuits.

A signal line 13 formed on the substrate 10 is connected to the terminal T21. A signal line 23 formed on the IC 20 is connected to the terminal T21. Therefore, th signal inputted to the terminal T11 is inputted to the signal line 23 via the signal line 13 and the terminal T21. The terminal T21 is a terminal for exchanging a signal(s) with an outside. The terminal T21 is also called an input/output terminal (I/O terminal). A signal line 14 formed on the substrate 10 is connected to the terminal T22. Further, a signal line 24 formed on the IC 20 is connected to the terminal T22. Therefore, the signal inputted to the terminal T12 is inputted to the signal line 24 via the signal line 14 and the terminal T22. The terminal T22 is a terminal for exchanging a signal(s) with an outside. The terminal T22 is also called an input/output terminal (I/O terminal).

The potential supply wiring LSU is connected to the wiring L11 via the terminal T31. Therefore, a first potential is supplied to the terminal T31 and the wiring L11. The terminal T31 is also called a first potential supply terminal SU. The wiring L12 is connected to a potential supply wiring (not shown), and a predetermined potential SU3 is supplied to the wiring L12. The ground wiring LGR is connected to the wiring L21 via the terminal T32. Therefore, a second potential is supplied to the terminal T32 and the wiring L21. The terminal T32 is also called a second potential supply terminal or a ground terminal GR. The wiring L22 is connected to the wiring L21. Therefore, the second potential is supplied to the wiring L22 via the wiring L21 and the terminal T32.

The I/O current detection load circuit 110 is connected to the wiring L11 and the signal line 23. Since the wiring L11 is connected to the terminal T31 and the signal line 23 is connected to the terminal T21, the I/O current detection load circuit 110 is electrically connected to the terminals T31 and T21. Specifically, the I/O current detection load circuit 110 has two terminals 111, 112, one terminal 111 being connected to the wiring L11 and the other terminal 112 being connected to the signal line 23.

The I/O current detection load circuit 120 is connected to the wiring L22 and the signal line 23. Since the wiring L22 is connected to the terminal T32 and the signal line 23 is connected to the terminal T21, the I/O current detection load circuit 120 is electrically connected to the terminals T32, T21. Specifically, the I/O current detection load circuit 120 has two terminals 121, 122, one terminal 121 being connected to the signal line 23 and the other terminal 122 being connected to the line L22.

The I/O current detection load circuit 130 is connected to the wiring L12 and the signal line 24. The wiring L12 is connected to the terminal T33 (see FIG. 2, referred to as a potential supply terminal SU3), and the signal line 24 is connected to the terminal T22, so that the I/O current detection load circuit 130 is electrically connected to the terminals T33, T22. Specifically, the I/O current detection load circuit 130 has two terminals 131, 132, one terminal 131 being connected to the wiring L12 and the other terminal 132 being connected to the signal line 24.

The I/O current detection load circuit 140 is connected to the wiring L21 and the signal line 24. Since the wiring L21 is connected to the terminal T32 and the signal line 24 is connected to the terminal T22, the I/O current detection load circuit 140 is electrically connected to the terminals T32, T22. Specifically, the I/O current detection load circuit 140 has two terminals 141, 142, one terminal 141 being connected to the signal line 24 and the other terminal 142 being connected to the line L21.

The current sensor circuit 1210 detects an I/O current that is a current flowing through the I/O current detection load circuit 110. Specifically, the current sensor circuit 1210 has two terminals 211, 212, one terminal 211 being connected to one terminal 111 of the I/O current sensing load circuit 110 and the other terminal 212 being connected to the other terminal 112 of the I/O current sense load circuit 110. The current sensor circuit 1210 acquires a sensor current proportional to the I/O current flowing through the I/O current detection load circuit 110, and outputs the acquired sensor current as output information.

Also, the current sensor circuit 1210 detects an I/O current, which is a current flowing through the I/O current detection load circuit 120. Specifically, the current sensor circuit 1210 further has two terminals 213, 214, one terminal 213 being connected to one terminal 121 of the I/O current sense load circuit 120 and the other terminal 214 being connected to the other terminal 122 of the I/O current sense load circuit 120. The current sensor circuit 1210 acquires a sensor current proportional to the I/O current flowing through the I/O current detection load circuit 120, and outputs the acquired sensor current as output information.

The current sensor circuit 1220 detects an I/O current, which is a current flowing through the I/O current detection load circuit 130. Specifically, the current sensor circuit 1220 has two terminals 221, 222, one terminal 221 being connected to one terminal 131 of the I/O current sensing load circuit 130 and the other terminal 222 being connected to the other terminal 132 of the I/O current sense load circuit 130. The current sensor circuit 1220 acquires a sensor current proportional to the I/O current flowing through the I/O current detection load circuit 130, and outputs the acquired sensor current as output information.

Also, the current sensor circuit 1220 detects a I/O current, which is a current flowing through the I/O current detection load circuit 140. Specifically, the current sensor circuit 1220 further has two terminals 223, 224, one terminal 223 being connected to one terminal 141 of the I/O current sense load circuit 140 and the other terminal 224 being connected to the other terminal 142 of the I/O current sense load circuit 140. The current sensor circuit 1220 acquires a sensor current proportional to the I/O current flowing through the I/O current detection load circuit 140, and outputs the acquired sensor current as output information.

The I/O current is an abnormal current flowing through the I/O terminal due to at least one of electrostatic discharge and electromagnetic susceptibility, and is a current greater than such a predetermined current as to make the semiconductor device 1001 an abnormal state.

The information processing circuit 310 is electrically connected to the current sensor circuit 1210. The information processing circuit 310 processes the output information outputted from the current sensor circuit 1210. The information processing circuit 320 is connected to the current sensor circuit 1220. The information processing circuit 320 processes the output information outputted from the current sensor circuit 1220. The information processing circuits 310, 320 output an abnormal signal(s) indicating that an abnormal current flows through at least one of the terminal T31 (potential supply terminal SU), the terminal T21 (input/output terminal, also called I/O terminal), the terminal T22 (input/output terminal, also called I/O terminal), the terminal T32 (ground terminal GR), or the like when at least one of the output information outputted from the current sensor circuit 1210 and the output information outputted from the current sensor circuit 1220 exceeds a predetermined threshold.

The power supply load circuit 21 has, for example, two terminals, one terminal being connected to the wiring L11 and the other terminal being connected to the wiring L21. The power supply load circuit 22 has, for example, two terminals, one terminal being connected to the wiring L12 and the other terminal being connected to the wiring L21.

By adopting such a configuration, the semiconductor device 1001 measures the ESD/EMS current flowing into the IC 20 from the terminals T11, T12, which project exteriorly from the substrate 10, via the terminals T21, T22 (input/output terminals, also called I/O terminals) by the current sensor circuits 1210, 1220. The information processing circuits 310, 320 grasp current stress amounts of the respective terminals T11, T12 by processing an amount of measured current. Then, the information processing circuits 310, 320 detect whether there is a possibility of the IC destruction or malfunction based on the grasped information.

Figure 2:
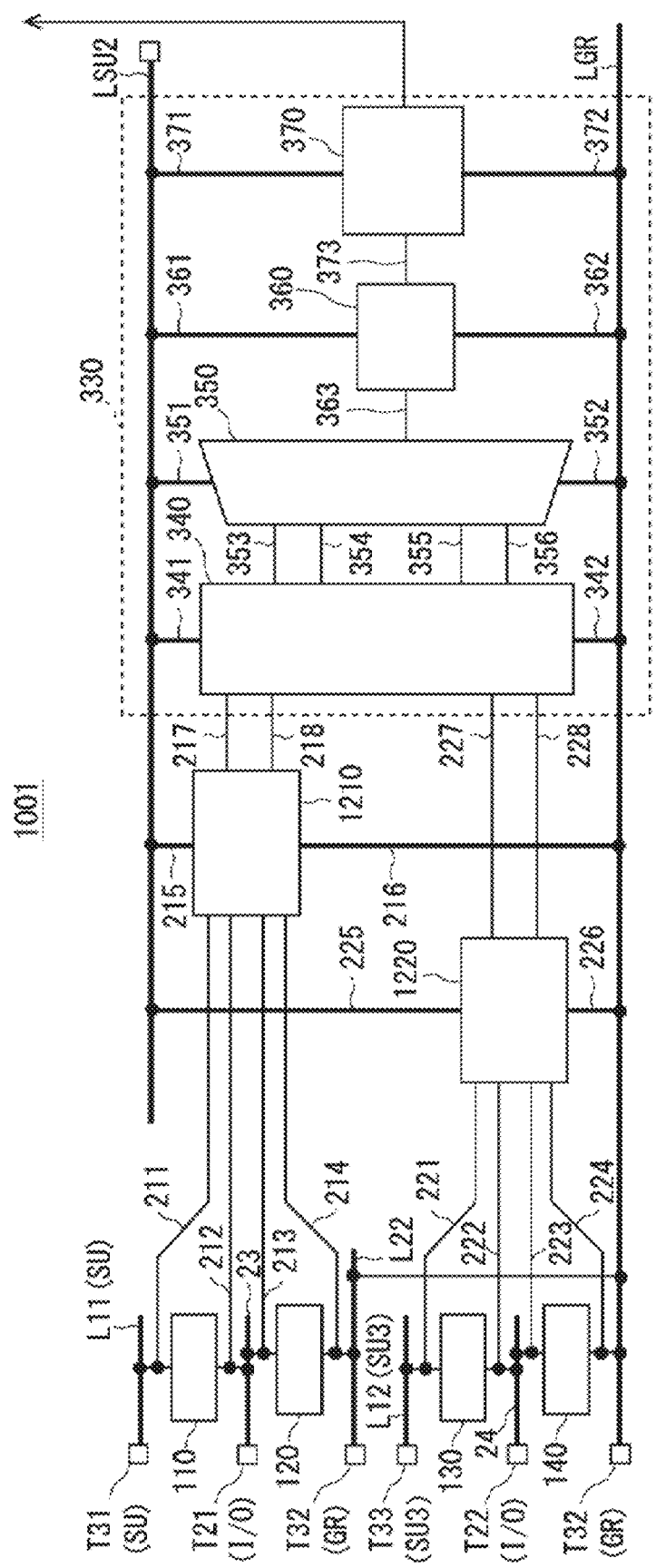
FIG. 2 is a configuration diagram illustrating a semiconductor device according to a comparative example.

FIG. 2 is a configuration diagram illustrating a semiconductor device 1001 according to a comparative example. As shown in FIG. 2, the current sensor circuit 1210 is electrically connected to the potential supply wiring LSU2 and the ground wiring LGR. Specifically, the current sensor circuit 1210 further has two terminals 215, 216, one terminal 215 being connected to the potential supply wiring LSU2 and the other terminal 216 being connected to the ground wiring LGR.

The current sensor circuit 1220 is electrically connected to the potential supply wiring LSU2 and the ground wiring LGR. Specifically, the current sensor circuit 1220 further has two terminals 225, 226, one terminal 225 being connected to the potential supply wiring LSU2 and the other terminal 226 being connected to the ground wiring LGR.

The reason why the current sensor circuits 1210, 1220 use the potential supply wiring LSU2 is to maintain consistency with the power supply voltages of the A/D conversion circuit 350, memory circuit 360, and CPU circuit 370 each configured to have a low withstand voltage even if the other power supplies (SU, SU3) are high withstand voltage terminals.

The current sensor circuit 1210 further has two terminals 217, 218. The two terminals 217, 218 are connected to the information processing circuit 330. The current sensor circuit 1210 outputs output information to the information processing circuit 330 via the two terminals 217, 218. The current sensor circuit 1220 further has two terminals 227, 228. The two terminals 227, 228 are connected to the information processing circuit 330. The current sensor circuit 1220 outputs output information to the information processing circuit 330 via the two terminals 227, 228.

The information processing circuit 330 is shown as a single unit of the above-mentioned information processing circuits 310, 320. The information processing circuit 330 may have a temporarily holding circuit 340, an A/D conversion circuit 350, a memory circuit 360, and a CPU circuit 370. The information processing circuit 330 is electrically connected to the potential supply wiring LSU2 and the ground wiring LGR. Specifically, each component of the information processing circuit 330 is electrically connected to the potential supply wiring LSU2 and the ground wiring LGR.

The temporarily holding circuit 340 has two terminals 341, 342, one terminal 341 being connected to the potential supply wiring LSU2 and the other terminal 342 being connected to the ground wiring LGR. Further, the temporarily holding circuit 340 is connected to the current sensor circuit 1210 by the terminals 217, 218. The temporarily holding circuit 340 is connected to the current sensor circuit 1220 by the terminals 227, 228. The temporarily holding circuit 340 temporarily holds an amount of current measured by the current sensor circuits 1210, 1220. Since a response speed of the A/D conversion circuit 350 cannot keep up with a speed of the ESD, the temporarily holding circuit 340 retains the currents measured by the current sensor circuits 1210, 1220 for such a time or longer that the response speed of the A/D conversion circuit 350 can keep up with it.

The A/D conversion circuit 350 has two terminals 351, 352, one terminal 351 being connected to the potential supply wiring LSU2 and the other terminal 352 being connected to the ground wiring LGR. Also, the A/D conversion circuit 350 is connected to the temporarily holding circuit 340. Specifically, the A/D conversion circuit 350 further has two terminals 353, 354, and each of the terminals 353, 354 is connected to the temporarily holding circuit 340. Further, the A/D conversion circuit 350 has two terminals 355, 356, and each of the terminals 355, 356 is connected to the temporarily holding circuit 340. The A/D conversion circuit 350 A/D-converts an amount of current measured by the current sensor circuits 1210, 1220.

The memory circuit 360 has two terminals 361, 362, one terminal 361 being connected to the potential supply wiring LSU2 and the other terminal 362 being connected to the ground wiring LGR. Also, the memory circuit 360 is connected to the A/D conversion circuit 350 via a terminal 363. Furthermore, the memory circuit 360 is connected to the CPU circuit 370 via a terminal 373. The memory circuit 360 stores the A/D-converted current amount. The memory circuit 360 outputs the stored current amount to the CPU circuit 370 as required. The memory circuit 360 uses a non-volatile memory when it is necessary to store the current amount for a long time.

The CPU circuit 370 has two terminals 371, 372, one terminal 371 being connected to the potential supply wiring LSU2 and the other terminal 372 being connected to the ground wiring LGR. The CPU circuit 370 reads the amount of current stored in the memory circuit 360, and performs operations and the like shown in some practical examples.

For example, when the semiconductor device 1001 is provided in an industrial motor as a practical example, it determines that there is a possibility of the destruction and malfunction of the IC 20 when the amount of current measured by the current sensor circuits 1210, 1220 exceeds a constant value, and informs the industrial motor of a determination result. Consequently, the semiconductor device 1001 can be prompted to perform safe actions such as motor stop and rotation speed reduction. Specifically, in the semiconductor device 1001, the information processing circuit 330, which adopts the above-mentioned configuration, temporarily holds the current amounts measured by the current sensor circuits 1210, 1220 in the temporarily holding circuit 340, A/D-converts it by the A/D conversion circuit 350, and then stores the A/D-converted current amounts in the memory circuit 360. Then, the information processing circuit 330 reads the current amounts stored in the memory circuit 360 with the CPU circuit 370, and performs the actions or the like shown in the practical example.

Figure 3:
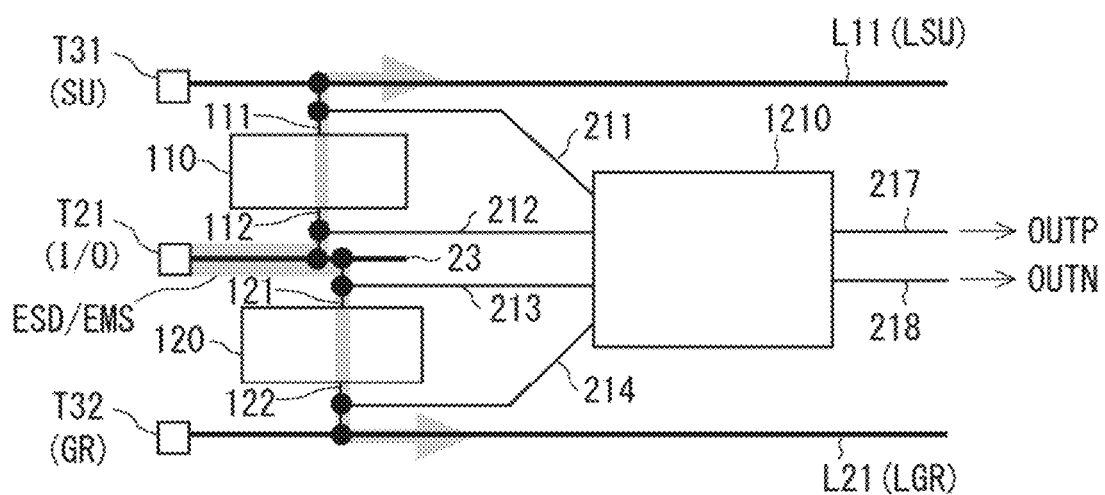
FIG. 3 is a configuration diagram illustrating an I/O current detection load circuit and a current sensor circuit in a semiconductor device according to a comparative example.

FIG. 3 is a configuration diagram illustrating the I/O current detection load circuits 110, 120 and the current sensor circuit 1210 in the semiconductor device 1001 according to the comparative example. As shown in FIG. 3, the current sensor circuit 1210 senses an I/O current flowing through the I/O current sense load circuits 110, 120. Specifically, the current sensor circuit 1210 has the following functions. That is, when the I/O current flows through the I/O current detection load circuit 110 on a potential supply terminal SU side (potential supply wiring LSU side), a measurement result of the current sensor circuit 1210 is outputted to the information processing circuit 330 via the terminal 217 (OUTP). When the I/O current flows through the I/O current detection load circuit 120 on a ground terminal GR side (ground wiring LGR side), a measurement result of the current sensor circuit 1210 is outputted to the information processing circuit 330 via the terminal 218 (OUTN).

Figure 4:
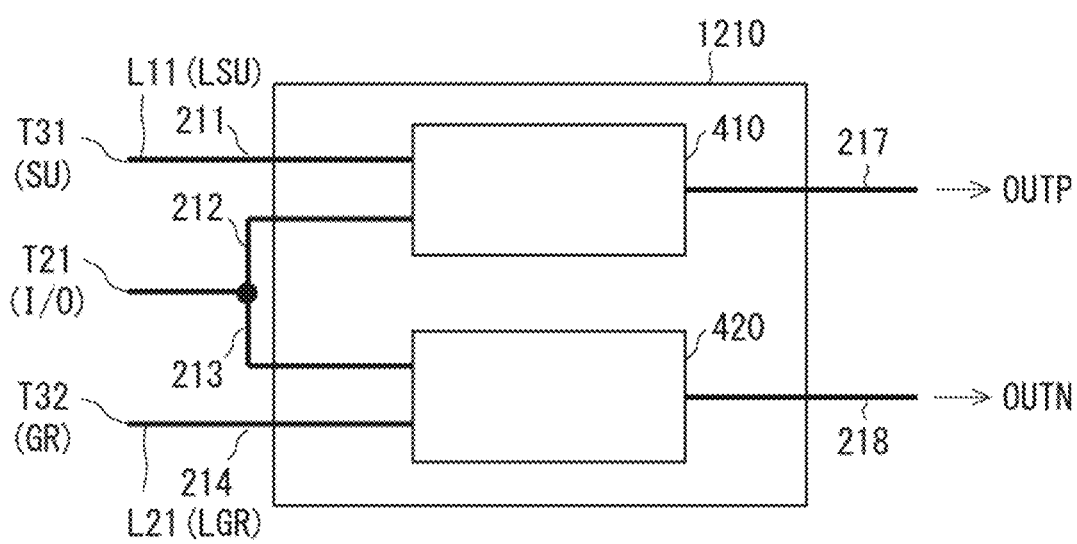
FIG. 4 is a configuration diagram illustrating a current sensor circuit in a semiconductor device according to a comparative example.

FIG. 4 is a configuration diagram illustrating the current sensor circuit 1210 in the semiconductor device 1001 according to the comparative example. As shown in FIG. 4, the current sensor circuit 1210 includes proportional circuits 410, 420. When an I/O current flows through the I/O current detection load circuit 110 on a potential supply terminal SU side (potential supply wiring LSU side), the proportional circuit 410 that outputs it to the terminal 217 (OUTP) responds. Specifically, a current measurement result of the proportional circuit 410 is outputted to the information processing circuit 330 via the terminal 217 (OUTP). When a current flows through the I/O current detection load circuit 120 on a ground terminal GR side (ground wiring LGR side), the proportional circuit 420 that outputs it to the terminal 218 (OUTN) responds. Specifically, a current measurement result of the proportional circuit 420 is outputted to the information processing circuit 330 via the terminal 218 (OUTN).

The same problem arises in both the potential supply terminal SU side (potential supply wiring LSU side) and the ground terminal GR side (ground wiring LGR side), so that the following description will be made by, for example, focusing the potential supply terminal SU side (potential supply wiring LSU side).

Figure 5:
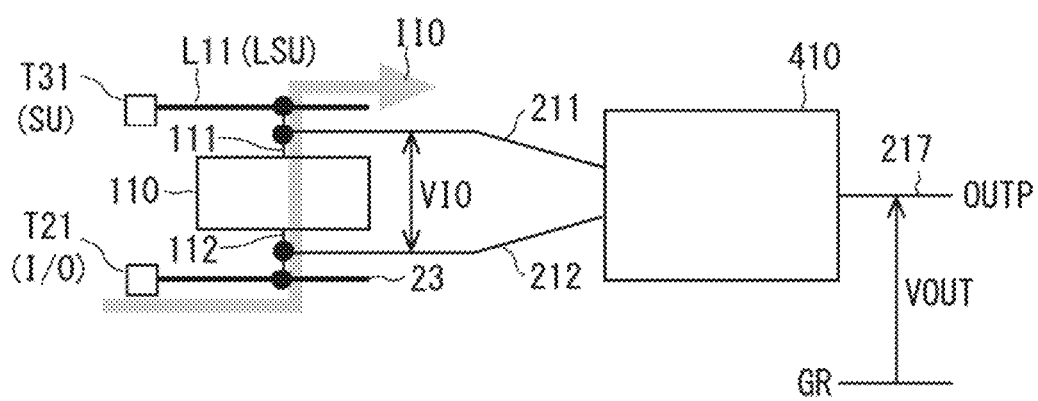
FIG. 5 is a configuration diagram illustrating an I/O current detection load circuit and a proportional circuit in a semiconductor device according to a comparative example.

FIG. 5 is a configuration diagram illustrating the I/O current detection load circuit 110 and the proportional circuit 410 in a semiconductor device 1001 according to a comparative example. As shown in FIG. 5, when an I/O current IIO flows through the I/O current detection load circuit 110, it is assumed that an input voltage inputted to the proportional circuit 410 is VIO. The input voltage VIO is a voltage between the terminals 111 and 112 of the I/O current sense load circuit 110. When the I/O current flows through the I/O current detection load circuit 110, the I/O current detection load circuit 110 generates the input voltage VIO between the terminal 112 into which the I/O current of the I/O current detection load circuit 110 flows and the terminal 111 into which the I/O current of the I/O current detection load circuit 110 flows. The input voltage VIO is inputted to the proportional circuit 410 by terminals 211, 212. In this case, an attempt is made to analogize the I/O current IIO flowing through the I/O current detection load circuit 110 by using the output voltage VOUT outputted from the proportional circuit 410.

Figure 6:
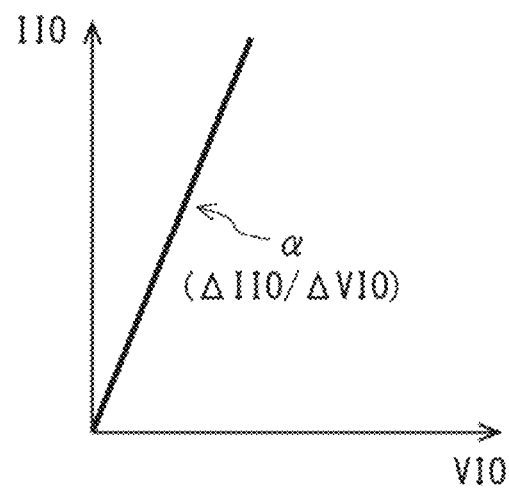
FIG. 6 is a graph exemplifying a I-V conversion coefficient $\alpha$ of an I/O current detection load circuit in a semiconductor device according to a comparative example, in which a horizontal axis indicates an input voltage between terminals and a vertical axis indicates a current flowing the I/O current detection load circuit.

FIG. 6 is a graph illustrating a I-V conversion coefficient $\alpha$ of the I/O current detection load circuit 110 in the semiconductor device 1001 according to the comparative example, a horizontal axis indicating the input voltage VIO between the terminals 111 and 112 and a vertical axis indicating the I/O current IIO flowing through the I/O current detection load circuit 110. As shown in FIG. 6, the I-V conversion coefficient $\alpha$ of the I/O current detection load circuit 110 is represented by $\Delta IIO/\Delta VIO$ as a slope of the graph. That is, the I-V conversion coefficient $\alpha$ is expressed by Equation (1). The I-V conversion coefficient $\alpha$ is a fixed value.

$$\alpha = (\Delta IIO/\Delta VIO) \tag{1}$$

Meanwhile, the proportional circuit 410 has a proportional constant $\beta$ of the output voltage VOUT with respect to the input voltage VIO. That is, the proportional constant $\beta$ is expressed by Equation (2). The proportional constant $\beta$ is a fixed value.

$$\beta = (\Delta VIO/\Delta VOUT) \tag{2}$$

Figure 7:
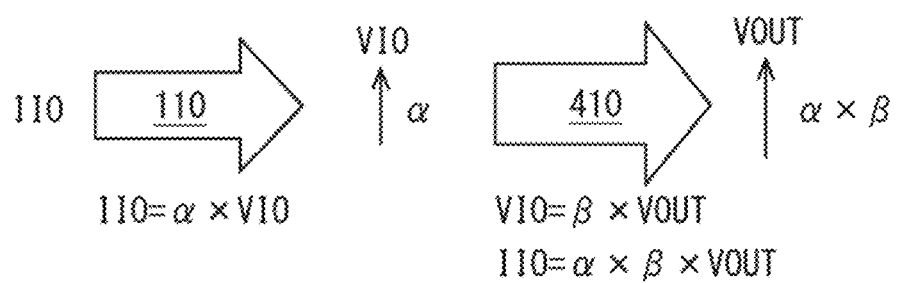
FIG. 7 is a diagram illustrating transitions of a I-V conversion coefficient $\alpha$ of an I/O current detection load circuit and a proportional constant $\beta$ of a proportional circuit in a semiconductor device according to a comparative example.

FIG. 7 is a diagram illustrating transitions of the I-V conversion coefficient $\alpha$ of the I/O current detection load circuit 110 and the proportional constant $\beta$ of the proportional circuit 410 in the semiconductor device 1001 according to the comparative example. As shown in FIG. 7, the I/O current IIO flowing through the I/O current detection load circuit 110 is obtained by multiplying the input voltage VIO by the I-V conversion coefficient $\alpha$. That is, the I/O current IIO is expressed by Equation (3).

$$IIO = \alpha \Delta VIO \tag{3}$$

The input voltage VIO inputted to the proportional circuit 410 is obtained by multiplying the output voltage VOUT outputted from the proportional circuit 410 by the proportional constant R. That is, the input voltage VIO is expressed by Equation (4).

$$VIO = \beta \times VOUT \tag{4}$$

Therefore, by using the I-V conversion coefficient $\alpha$ of the I/O current detection load circuit 110 and the proportional constant $\beta$ of the proportional circuit 410, the I/O current flowing from the output voltage VOUT of the proportional circuit 410 to the I/O current detection load circuit 110 can be obtained by Equation (5) described below.

$$IIO = \alpha \times \beta \times VOUT \tag{5}$$

In order to obtain such an I/O current IIO, the I-V conversion coefficient $\alpha$ of the I/O current detection load circuit 110 and the proportional constant $\beta$ of the proportional circuit 410 need to be specified. However, the characteristics of the I/O current detection load circuit 110 vary greatly depending on a speed and a waveform shape of the IIO current. Therefore, it is difficult to uniquely specify the I-V conversion coefficient $\alpha$ of the I/O current detection load circuit 110.

Figure 8:
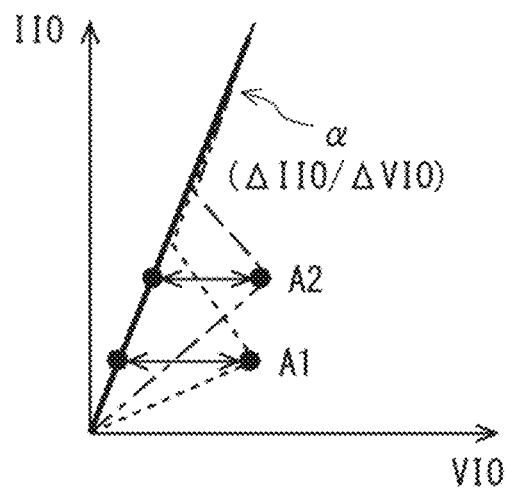
FIG. 8 is a graph illustrating characteristics added to an I-V conversion coefficient $\alpha$ of an I/O current detection load circuit in a semiconductor device according to a comparative example, in which a horizontal axis indicates an input voltage between terminals, and a vertical axis indicates a current flowing through the I/O current detection load circuit.

FIG. 8 is a graph illustrating characteristics added to the I-V conversion coefficient $\alpha$ of the I/O current detection load circuit 110 in the semiconductor device 1001 according to the comparative example, a horizontal axis indicating the input voltage VIO between the terminals 111 and 112 and a vertical axis indicating the I/O current IIO flowing through the I/O current detection load circuit 110. As shown in FIG. 8, characteristics A1, A2 are added to the I-V conversion coefficient $\alpha$ according to a speed and a shape of the I/O current IIO flowing through the I/O current detection load circuit 110. Therefore, a current measurement error for an offset that it is difficult to identify occurs, and current measurement accuracy of the proportional circuit 410 may deteriorate.

Figure 9:
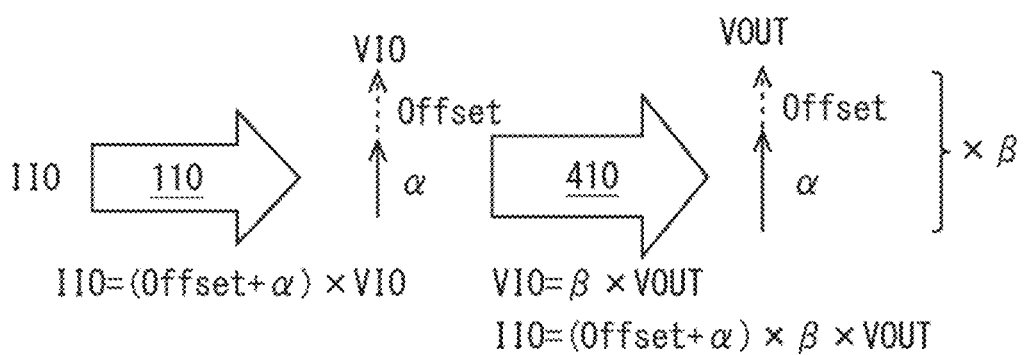
FIG. 9 is a diagram illustrating transitions of a I-V conversion coefficient $\alpha$ of an I/O current detection load circuit and a proportional constant $\beta$, of a proportional circuit in a semiconductor device according to a comparative example.

FIG. 9 is a diagram illustrating transitions of the I-V conversion coefficient $\alpha$ of the I/O current detection load circuit 110 and the proportional constant $\beta$ of the proportional circuit 410 in the semiconductor device 1001 according to the comparative example. As shown in FIG. 9, since an offset Offset is added to the I-V conversion coefficient $\alpha$, the I/O current IIO flowing through the I/O current detection load circuit 110 is obtained by multiplying the input voltage VIO by the I-V conversion coefficient (Offset+$\alpha$). That is, the I/O current IIO is expressed by Equation (6).

$$IIO = (Offset + \alpha) \times VIO \tag{6}$$

The input voltage VIO inputted to the proportional circuit 410 is obtained by multiplying the output voltage VOUT outputted from the proportional circuit 410 by a proportional constant R. That is, the input voltage VIO is expressed by Equation (7).

$$VIO = \beta \times VOUT \tag{7}$$

Therefore, by using the I-V conversion coefficient (Offset+$\alpha$) of the I/O current detection load circuit 110 and the proportional constant $\beta$ of the proportional circuit 410, the I/O current IIO flowing through the I/O current detection load circuit 110 from the output voltage VOUT of the proportional circuit 410 can be obtained by Equation (8) described below.

$$IIO = (Offset + \alpha) \times \beta \times VOUT \tag{8}$$

When the offset Offset is included and the current measurement accuracy of the proportional circuit 410 is degraded, the inventor has found a new problem in which it is difficult to establish a mechanism for obtaining the I/O current IIO described above. That is, the I/O current detection load circuit 110 has a first coefficient that is a ratio of the I/O current IIO to the input voltage VIO, the first coefficient being not constant and the I/O current IIO being not proportional to the input voltage VIO. Therefore, even when the I/O current IIO flowing through the I/O current detection load circuit 110 is small, the I/O current detection load circuit 110 may erroneously recognize that the large I/O current IIO is flowing and may erroneously detect that the terminal T21 or the like having no stress by rights is stressed by an ESD/EMS current or the like. Further, even when the large I/O current IIO flows through the I/O current detection load circuit 110, the I/O current detection load circuit 110 may erroneously recognize that only the small I/O current IIO is flowing and may overlook the terminal T21 or the like having any stress by rights. For these reasons, it is desired to improve the measurement accuracy of currents such as noise currents.

First Embodiment

Next, a semiconductor device according to a first embodiment will be described. The present embodiment improves the current measurement accuracy of the proportional circuit 410 shown in the comparative example, and moves establish a mechanism for obtaining the current IIO flowing through the I/O current detection load circuit 110.

Figure 10:
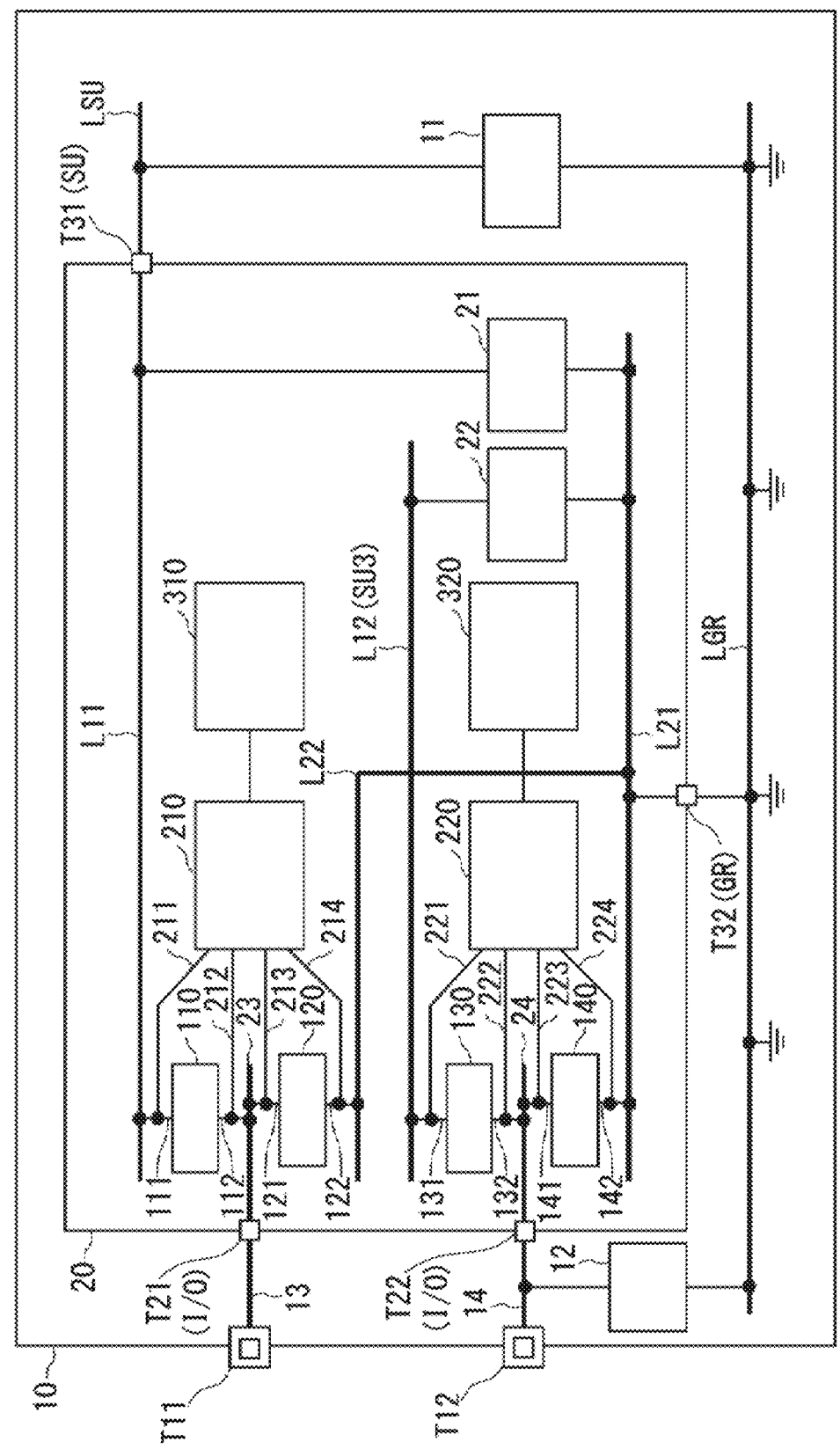
FIG. 10 is a configuration diagram illustrating a semiconductor device according to a first embodiment.

FIG. 10 is a configuration diagram illustrating a semiconductor device according to a first embodiment. As shown in FIG. 10, a semiconductor device 1 of the present embodiment includes current sensor circuits 210, 220 instead of the current sensor circuits 1210, 1220 in the comparative example. Other configurations are the same as those of the semiconductor device 1001 in the comparative example. <Constructions of Proportional Circuit and Proportional Current Acquisition Load Circuit> will be described below, and then <Specific Circuit Example of Proportional Circuit> will be described. In addition, <Size Reduction of Proportional Current Acquisition Load Circuit> for solving another problem will be described.

Figure 11:
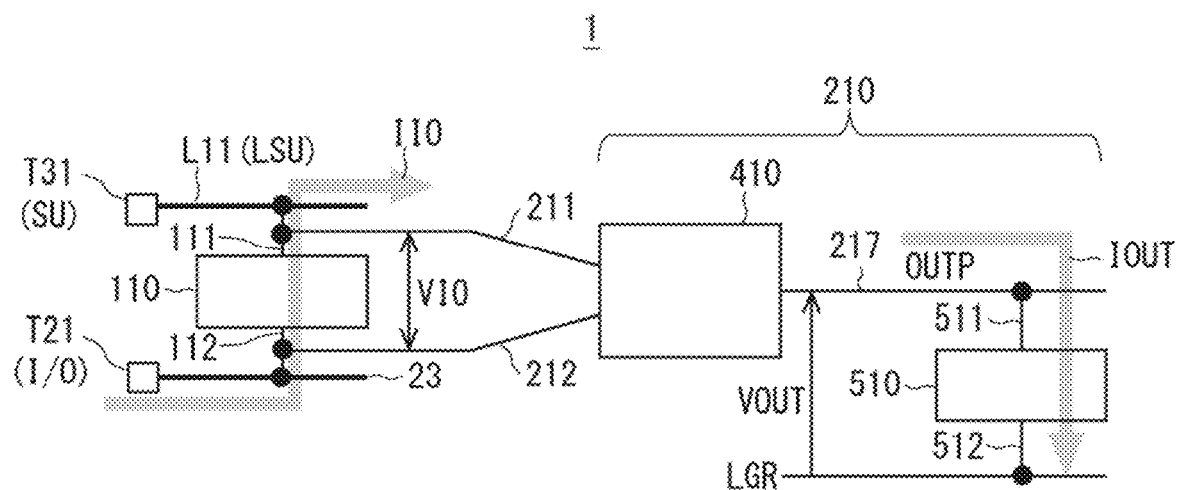
FIG. 11 is a configuration diagram illustrating an I/O current detection load circuit and a current sensor circuit in the semiconductor device according to the first embodiment.

Configurations of Proportional Circuit and Proportional Current Acquisition Load Circuit FIG. 11 is a configuration diagram illustrating the I/O current detection load circuit 110 and the current sensor circuit 210 in the semiconductor device 1 according to the first embodiment. As shown in FIG. 11, the current sensor circuit 210 of the present embodiment has a proportional circuit 410 and a proportional current acquisition load circuit 510. The proportional current acquisition load circuit 510 is electrically connected to the proportional circuit 410.

The proportional circuit 410 is connected to terminals 211, 212. Therefore, when the I/O current IIO flows through the I/O current detection load circuit 110 on a potential supply terminal SU side (potential supply wiring LSU side), the proportional circuit 410 outputs a current measurement result to the terminal 217 (OUTP). A proportional constant β of the proportional circuit 410 is set to be a single multiple. Incidentally, the single multiple means not only strictly a single multiple but also approximately a single multiple including unavoidable ranges such as measurement errors. The same applies to a single multiple which will be described later.

The proportional current acquisition load circuit 510 is connected to the terminal 217 and the ground wiring LGR. Specifically, the proportional current acquisition load circuit 510 has two terminals 511, 512, one terminal 511 being connected to the terminal 217 and the other terminal 512 being connected to the ground wiring LGR. The Proportional current acquisition load circuit 510 uses the same load circuit as the I/O current detection load circuit 110.

The proportional current acquisition load circuit 510 is a load circuit for acquiring a current proportional to the I/O current IIO and, in other words, is also called a load circuit for canceling current measurement errors that are caused by changes in the I-V conversion coefficient α due to influences of a speed and a shape of the I/O current flowing the I/O current detection load circuit 110. The configurations of the I/O current detection load circuit 110 and the proportional current acquisition load circuit 510 include, for example, PN junction diodes and MOS transistors, etc. which will be described later. Incidentally, the configuration of the load circuit is not limited to these.

In this way, in the semiconductor device 1 of the present embodiment, the current sensor circuit 210 multiples the proportional constant β of the proportional circuit 410 by a single multiple, and uses the same load circuit as the I/O current detection load circuit 110 as the proportional current acquisition load circuit 510. Consequently, the current sensor circuit 210 can acquire an output current IOUT proportional to the I/O current IIO flowing through the I/O current detection load circuit 110. The output current IOUT is also called a sensor current. If the proportional constant β of the proportional circuit 410 is set to be a single multiple, the output current IOUT (sensor current) is equivalent to the I/O current 110. That is, the proportional circuit 410 has an input voltage as an input and outputs as an output voltage a voltage obtained by multiplying the input voltage by approximately a single multiple. The proportional circuit 410 inputs the output voltage to the proportional current acquisition load circuit 510 and causes the proportional current acquisition load circuit 510 to flow the output current IOUT (sensor current). In the proportional current acquisition load circuit 510, an output voltage VOUT is inputted between the terminal 511 into which the output current IOUT flows and the terminal 512 from which the output current IOUT flows. The current sensor circuit 210 outputs as output information the acquired output current IOUT to the information processing circuit 310.

Figure 12:
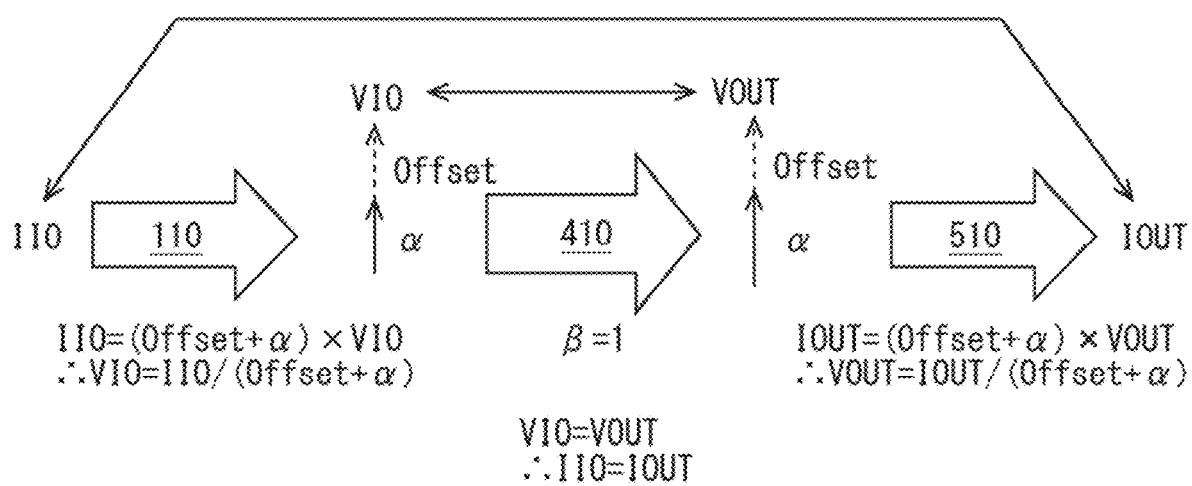
FIG. 12 is a diagram illustrating transition of a I-V conversion coefficient $\alpha$ of the I/O current detection load circuit and a proportional constant $\beta$, of the proportional circuit in the semiconductor device according to the first embodiment.

FIG. 12 is a diagram illustrating transitions of the I-V conversion coefficient α of the I/O current detection load circuit 110 and the proportional constant β, of the proportional circuit 410 in the semiconductor device according to the first embodiment. As shown in FIG. 12, since an offset Offset is added to the I-V conversion coefficient α, the I/O current IIO flowing through the I/O current detection load circuit 110 is obtained by multiplying the input voltage VIO by the I-V conversion coefficient (Offset+α). That is, the I/O current IIO is expressed by Equation (9).

$$IIO=(\text{Offset}+\alpha)\times VIO \quad (9)$$

The output current IOUT flowing through the proportional current acquisition load circuit 510 is obtained by multiplying the output voltage VOUT of the proportional circuit 410 by the I-V conversion factor (Offset+α). That is, the output current IOUT is expressed by Equation (10).

$$IOUT=(\text{Offset}+\alpha)\times VOUT \quad (10)$$

Equations (9) and (10) can be transformed into Equations (11) and (12).

$$VIO=IIO/(\text{Offset}+\alpha) \quad (11)$$

$$VOUT=IOUT/(\text{Offset}+\alpha) \quad (12)$$

Here, since the proportional constant β=1, Equation (13) is met. This is because the proportional circuit 410 operates according to Equation (7) of VIO=β×VOUT.

$$\text{VIO=VOUT} \tag{13}$$

Equation (14) is derived from Equation (13) by using Equations (11) and (12).

$$\text{IIO=IOUT} \tag{14}$$

In the present embodiment, since the same voltages as the input voltage VIO and the output voltage VOUT are respectively applied to the I/O current detection load circuit 110 and the proportional current acquisition load circuit 510 of the same load circuit, the present embodiment has a feature in which the current IIO and the output current IOUT are equivalent to each other.

In other words, the proportional current acquisition load circuit 510 has a second coefficient that is a ratio of the output current IOUT (sensor current) and the output voltage VOUT. A ratio of the first coefficient and the second coefficient is approximately a single multiple and is equivalent to each other. The I/O current IIO is a product of the first coefficient and the input voltage VIO. The output current IOUT (sensor current) is a product of the second coefficient and the output voltage VOUT. Since the ratio of the input voltage VIO and the output voltage VOUT is approximately a single multiple, the input voltage VIO and the output voltage VOUT are equivalent to each other. Since the ratio of the first coefficient and the second coefficient is approximately a single multiple, the first coefficient and the second coefficient are equivalent to each other. The I/O current IIO can be replaced by the product of the second coefficient and the output voltage VOUT. The output current IOUT (sensor current) can be replaced by the product of the first coefficient and the input voltage VIO. The ratio of the I/O current IIO and the output current IOUT becomes approximately a single multiple, and the I/O current IIO and the output current IOUT (sensor current) are proportional.

In this way, the semiconductor device of the present embodiment measures at least one of the ESD current and the EMS current flowing into the IC 20 from a terminal, which projects exteriorly from the substrate 10, by using the current sensor circuit 210 in the IC 20. The current sensor circuit 210 can cancel the offset of the I-V conversion coefficient α of the proportional circuit 410 by means of the proportional current acquisition load circuit 510. This makes it possible to improve the measurement accuracy of the current amount such as noise. Then, by processing the measured current amount with the information processing circuit 330, the current sensor circuit 210 grapes a current stress amount of each terminal and can detect whether there is a possibility of destruction or malfunction of the IC 20 based on the information. Thus, the destruction and malfunction of the IC 20 can be appropriately suppressed.

<Specific Circuit Example of Proportional Circuit>

Next, a specific circuit example of the proportional circuit 410 will be described. First, a circuit example for measuring an I/O current IIOP flowing from the terminal T21 (input/output terminal, also called I/O terminal) to a potential supply wiring LSU side (potential supply terminal SU side) will be described. The I/O current IIOP is referred to as a positive current in the present embodiment.

Figure 13:
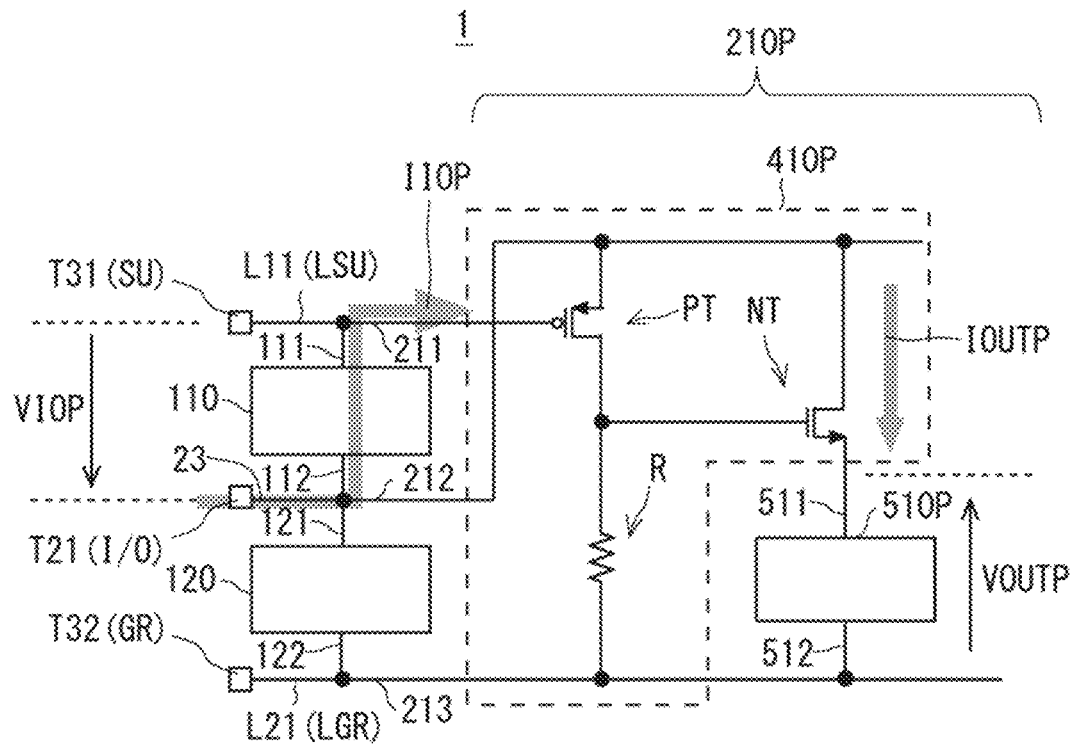
FIG. 13 is a circuit diagram illustrating the current sensor circuit in the semiconductor device according to the first embodiment.

FIG. 13 is a circuit diagram illustrating a current sensor circuit in a semiconductor device 1 according to the first embodiment. As shown in FIG. 13, a current sensor circuit 210P has a proportional circuit 410P and a proportional current acquisition load circuit 510P. The proportional circuit 410P includes a P-type transistor PT, an N-type transistor NT, and a resistor R.

A gate of the P-type transistor PT is connected to a potential supply wiring LSU. A source of the P-type transistor PT is connected to the terminal T21 via the terminal 212 and the signal line 23. A drain of the P-type transistor PT is connected to one end of the resistor R.

The one end of the resistor R is connected to the drain of the P-type transistor PT. The other end of the resistor R is connected to the ground wiring LGR via the terminal 213.

A gate of the N-type transistor NT is connected to the drain of the P-type transistor PT and the one end of the resistor R. A source of the N-type transistor NT is connected to a terminal 511 of the proportional current acquisition load circuit 510P. A drain of the N-type transistor NT is connected to the source of the P-type transistor and a terminal 212. A terminal 512 of the proportional current acquisition load circuit 510P is connected to the ground wiring LGR via the other end of the resistor and the terminal 213.

Here, the I/O current flowing through the I/O current detection load circuit 110 is called IIOP, an input voltage of the proportional circuit 410P is called VIOP, an output voltage of the proportional circuit 410P is called VOUTP, and an output current (sensor current) of the proportional circuit 410P is called IOUTP. The I-V conversion coefficient of the I/O current detection load circuit 110 is Offset (fluctuation value)+α (fixed value). The proportional constant of the proportional circuit 410P is β (fixed value), and is ΔVIOP/ΔVOUTP.

The proportional circuit 410P obtains the output current IOUTP equivalent to the positive current IIOP flowing through the I/O current detection load circuit 110 by the following Actions.

Action 1. When the positive current IIOP flows through the input/output terminal (terminal T21, also called I/O terminal), the input voltage VIOP is generated between the input/output terminal and the potential supply terminal SU.

Action 2. The proportional circuit 410P operates with the proportional constant β≈1. That is, Equation (15) is met similarly to Equation (13).

$$\text{VIOP=VOUTP} \tag{15}$$

Action 3. Since the I/O current detection load circuit 110 and the proportional current acquisition load circuit 510P are the same load circuit, Equations (16) to (20) described below are met similarly to Equations (9) to (12).

$$\text{IIOP=(Offset+α)×VIOP} \tag{16}$$

$$\text{IOUTP=(Offset+α)×VOUTP} \tag{17}$$

$$\text{VIOP=IIOP/(Offset+α)} \tag{18}$$

$$\text{VOUTP=IOUTP/(Offset+α)} \tag{19}$$

Equation (20) is obtained from a relationship of Equation (15).

$$\text{IIOP=IOUTP} \tag{20}$$

Next, a circuit example for measuring the I/O current IION flowing from the terminal T32 (ground terminal GR) on a ground wiring LGR side to the terminal T21 (input/output terminal, also called I/O terminal) will be described. The I/O current IION is referred to as a negative current in the present embodiment.

Figure 14:
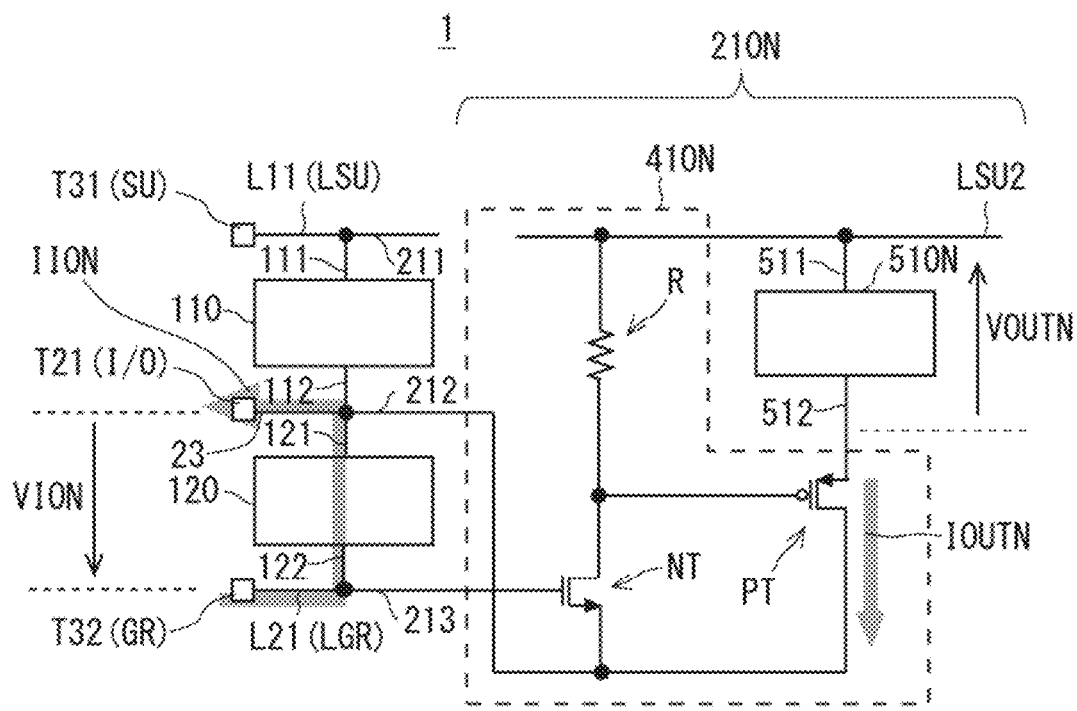
FIG. 14 is a circuit diagram illustrating a current sensor circuit in the semiconductor device according to the first embodiment.

FIG. 14 is a circuit diagram illustrating a current sensor circuit in the semiconductor device 1 according to the first embodiment. As shown in FIG. 14, a current sensor circuit 210N includes a proportional circuit 410N and a proportional current acquisition load circuit 510N. The proportional circuit 410N includes an N-type transistor NT, a P-type transistor PT, and a resistor R.

A gate of the N-type transistor NT is connected to the ground wiring LGR. A source of the N-type transistor NT is connected to the terminal T21 via the terminal 212 and the signal line 23. A drain of the N-type transistor NT is connected to one end of the resistor R.

The one end of the resistor R is connected to the drain of the N-type transistor NT. The other end of the resistor R is connected to a potential supply wiring LSU2.

A gate of the P-type transistor PT is connected to the drain of the N-type transistor NT and the one end of the resistor R. A source of the P-type transistor PT is connected to a terminal 512 of the proportional current acquisition load circuit 510N. The drain of the P-type transistor PT is connected to the terminal T21 via the source of the N-type transistor NT and the terminal 212. A terminal 511 of the proportional current acquisition load circuit 510N is connected to the potential supply wiring LSU2.

Here, an I/O current flowing through the I/O current detection load circuit 120 is called IION, an input voltage of the proportional circuit 410N is called VION, an output voltage of the proportional circuit 410N is called VOUTN, and an output current of the proportional circuit 410N is called IOUTN. The I-V conversion coefficient of the I/O current detection load circuit 120 is Offset (fluctuation value)+α (fixed value). A proportional constant of the proportional circuit 410N is β (fixed value) and is $\Delta$VION/$\Delta$VOUTN.

The proportional circuit 410N acquires an I/O current IOUTN equivalent to the negative current IION flowing through the I/O current detection load circuit 120 by the following Actions.

Action 1. When the negative current IION flows through the input/output terminal (terminal T21, also called I/O terminal), an input voltage VION is generated between the input/output terminal and the ground terminal GR.
Action 2. The proportional circuit 410N operates with the proportional constant β≈1. That is, Equation (21) is met similarly to Equation (15).

$$VION = VOUTN \quad (21)$$

Action 3. Since the I/O current detection load circuit 120 and the proportional current acquisition load circuit 510N are the same load circuit, Equations (22) to (26) described above are met similarly to Equations (16) to (20) mentioned above.

$$IION = (Offset + \alpha) \times VION \quad (22)$$

$$IOUTN = (Offset + \alpha) \times VOUTN \quad (23)$$

$$VION = IION/(Offset + \alpha) \quad (24)$$

$$VOUTN = IOUTN/(Offset + \alpha) \quad (25)$$

Equation (26) is obtained from a relationship of Equation (21).

$$IION = IOUTN \quad (26)$$

The above-mentioned semiconductor device may have the following two problems in actual use. One problem is an increase in layout area. It is conceivable that an increase in area on the IC 20, which is equivalent to those of a protection circuit, a driver circuit, and the like occurs. The other problem is a concern about chip internal breakdown due to an increase in chip internal current of the IC 20. The I/O current IIOP flowing through the I/O current detection load circuit 110 and the I/O current IION flowing through the I/O current detection load circuit 120 are up to several amperes maximum. If an equivalent current flows inside the chip of the IC 20, an inside of the chip may be destroyed. Due to such concerns, the proportional current acquisition load circuits 510P, 510N have preferably the same size as the I/O current detection load circuits 110, 120 or smaller sizes than the I/O current detection load circuits 110, 120.

Reduction in Size of Proportional Current Acquisition Load Circuit

Figure 15:
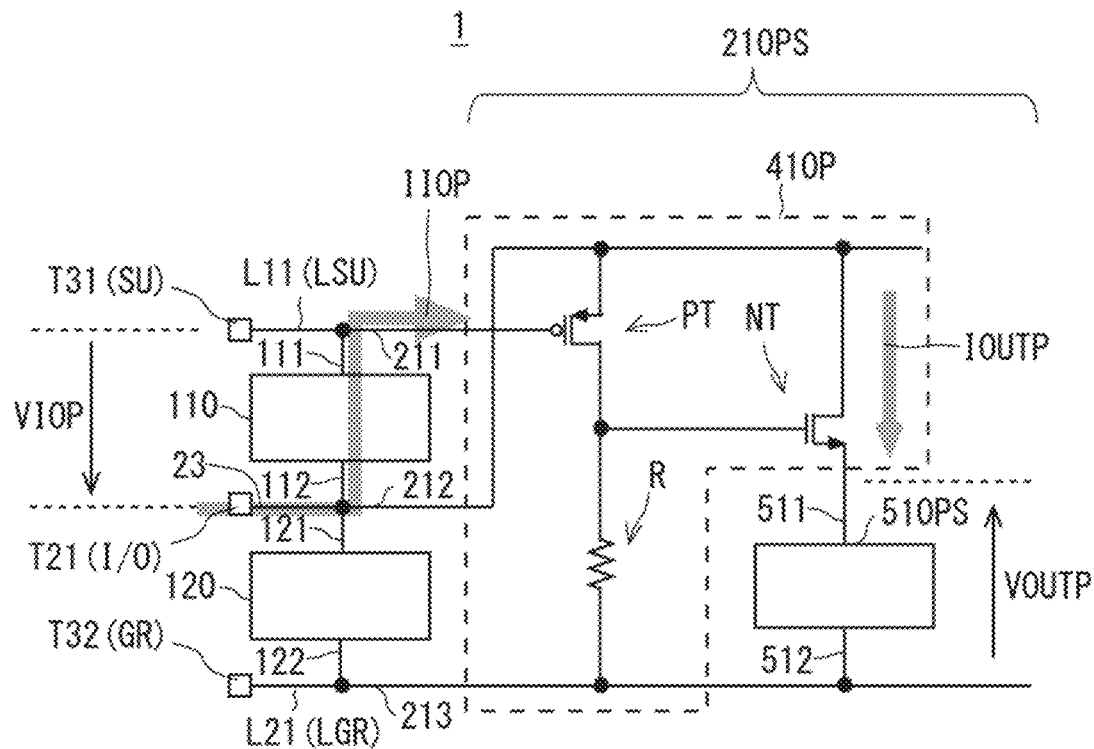
FIG. 15 is a circuit diagram illustrating a current sensor circuit in the semiconductor device according to the first embodiment.

FIG. 15 is a circuit diagram illustrating a current sensor circuit in the semiconductor device 1 according to the first embodiment. As shown in FIG. 15, the current sensor circuit 210PS has a proportional circuit 410P and a proportional current acquisition load circuit 510PS. The proportional current acquisition load circuit 510PS has the same size as the I/O current detection load circuit 110 or a smaller size than the I/O current detection load circuit 110.

Here, a method for reducing a size of the proportional current acquisition load circuit 510PS is shown below. First, a case of a circuit for measuring the I/O current IIOP flowing from the input/output terminal (terminal T21, also called I/O terminal) to the potential supply line LSU side will be described. The output current IOUTP (sensor current) proportional to the I/O current IIOP flowing through the I/O current detection load circuit 110 is obtained by the following Actions 1 to 4.
Action 1. When the positive current IIOP flows through the input/output terminal (terminal T21), an input voltage VIOP is generated between the input/output terminal and the potential supply terminal SU.
Action 2. The proportional circuit 410P operates with the proportional constant β≈1. That is, Equation (15) is met.
Action 3. The I/O current detection load circuit 110 and the proportional current acquisition load circuit 510PS are the same load circuit, and the proportional current acquisition load circuit 510PS is smaller in size than the I/O current detection load circuit 110. Therefore, Equation (27) mentioned below is met.

$$\text{Size of I/O Current Detection Load Circuit110: Size of Proportional Current Aquation Load Circuit510PS} = 1:N(1 > N) \quad (27)$$

Action 4. Equations (28) to (32) mentioned below are met.

$$IIOP = (Offset + \alpha) \times VIOP \quad (28)$$

$$IOUTP = (Offset + \alpha) \times VOUTP \times N \quad (29)$$

$$VIOP = IIOP/(Offset + \alpha) \quad (30)$$

$$VOUTP = IOUTP/(Offset + \alpha) \times 1/N \quad (31)$$

Equation (32) is obtained from a relationship of Equation (15).

$$IIOP = IOUTP \times 1/N \quad (32)$$

Figure 16:
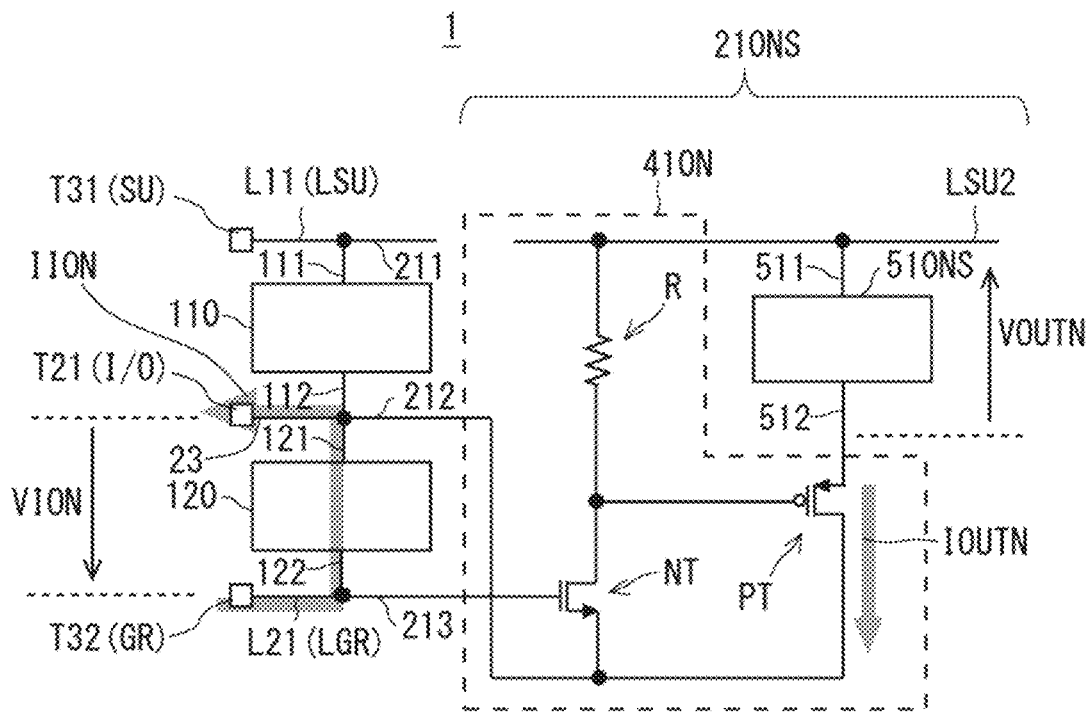
FIG. 16 is a circuit diagram illustrating a current sensor circuit in the semiconductor device according to the first embodiment.

Next, a case of a circuit for measuring the I/O current IION flowing from the terminal T32 (ground terminal GR), which is connected to the ground wiring LGR, to the input/output terminal (terminal T21, also called I/O terminal) will be described. FIG. 16 is a circuit diagram illustrating a current sensor circuit in the semiconductor device 1 according to the first embodiment. As shown in FIG. 16, a current sensor circuit 210NS includes a proportional circuit 410N and a proportional current acquisition load circuit 510NS. The proportional current acquisition load circuit 510NS is smaller in size than the I/O current detection load circuit 120. A current IOUTN proportional to the current IION flowing through the I/O current detection load circuit 120 is acquired by Actions 1 to 4 mentioned below.

Action 1. When a negative current IION flows through the input/output terminal (terminal T21), an input voltage VION is generated between the input/output terminal and the ground terminal GR.

Action 2. The proportional circuit 410N operates with the proportional constant β≈1. That is, Equation (21) is met.

Action 3. The I/O current detection load circuit 120 and the proportional current acquisition load circuit 510NS are the same load circuit, and the proportional current acquisition load circuit 510NS is smaller in size than the I/O current detection load circuit 120. Therefore, Equation (33) is met.

Size of I/O Current Detection Load Circuit 120:Size of Proportional Current Aquation Load Circuit 510NS=1:N(1>N)   (33)

Action 4. Equations (34) to (38) mentioned below are met.

$$IION=(Offset+\alpha) \times VION \quad (34)$$

$$IOUTN=(Offset+\alpha) \times VOUTN \times N \quad (35)$$

$$VION=IION/(Offset+\alpha) \quad (36)$$

$$VOUTN=IOUTN/(Offset+\alpha) \times 1/N \quad (37)$$

Equation (38) is obtained from a relationship of Equation (21).

$$IION=IOUTN \times 1/N \quad (38)$$

Thus, even if the sizes of the I/O current detection load circuits 110, 120 and the proportional current acquisition load circuit 510 are different, for example, even if the size of the proportional current acquisition load circuit 510 is small, the I/O current and the output current (sensor current) become proportional. Therefore, the ratio between the first coefficient and the second coefficient is approximately a constant multiple. The I/O current is the product of the first coefficient and the input voltage. The sensor current is the product of the second coefficient and the output voltage. Since the ratio of the input voltage to the output voltage is approximately a single multiple, the input voltage and the output voltage are equivalent. Since the ratio of the first coefficient and the second coefficient is approximately a constant multiple, the first coefficient and the second coefficient are proportional. The I/O current is proportional to the product of the second coefficient and the output voltage. The sensor current is proportional to the product of the first coefficient and the input voltage. The I/O current and the sensor current are proportional.

By adopting such a configuration, an increase in layout area of the semiconductor device 1 can be suppressed, and an increase in area can be suppressed in comparison with the protection circuit, the driver circuit, and the like. Further, it is possible to suppress the increase in chip internal current of the IC 20 and suppress the chip internal breakdown.

Second Embodiment

Next, a semiconductor device according to a second embodiment will be described. A semiconductor device of the present embodiment includes a conversion circuit that outputs as voltages the output currents IOUTP and IOUTN of the proportional circuit 410. First, a case of a circuit for measuring an I/O current IIOP flowing from an input/output terminal (terminal T21, also called I/O terminal) to the potential supply line LSU side will be described.

Figure 17:
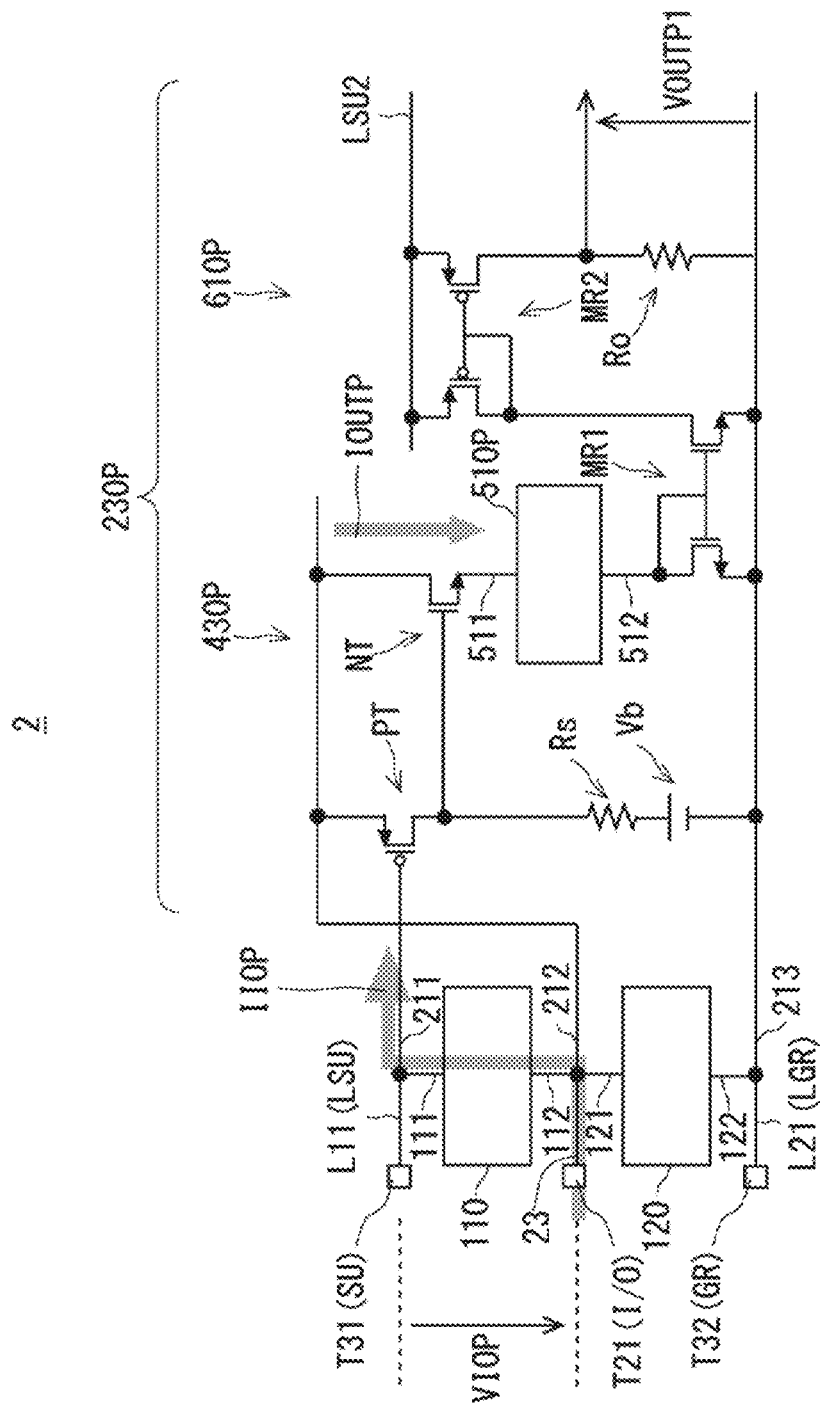
FIG. 17 is a circuit diagram illustrating a current sensor circuit in a semiconductor device according to a second embodiment.

FIG. 17 is a circuit diagram illustrating a current sensor circuit in a semiconductor device according to a second embodiment. As shown in FIG. 17, in a semiconductor device 2 of the present embodiment, the current sensor circuit 230P includes a proportional circuit 430P, a proportional current acquisition load circuit 510P, and a conversion circuit 610P. The proportional circuit 430P includes a P-type transistor PT, an N-type transistor NT, a resistor Rs, and a bias Vb. The conversion circuit 610P includes a current mirror MR1, a current mirror MR2, and a resistor Ro. The conversion circuit 610P converts an output current IOUTP of the proportional circuit 430P into an output voltage. The output current IOUTP is also called a sensor current, and the output voltage is also called a sensor voltage. The conversion circuit 610P outputs the converted output voltage to an information processing circuit 310 as output information.

A gate of the P-type transistor PT is connected to the potential supply wiring LSU. A source of the P-type transistor PT is connected to the terminal T21 via a terminal 212 and the signal line 23. A drain of the P-type transistor PT is connected to one end of the resistor Rs.

The one end of the resistor Rs is connected to the drain of the P-type transistor PT. The other end of the resistor Rs is connected to a positive terminal of the bias Vb. A negative terminal of the bias Vb is connected to the ground wiring LGR through a terminal 213.

A gate of the N-type transistor NT is connected to the drain of the P-type transistor PT and the one end of the resistor R. A source of the N-type transistor NT is connected to a terminal 511 of the proportional current acquisition load circuit 510P. A drain of the N-type transistor NT is connected to the terminal T21 via the source of the P-type transistor PT and the terminal 212.

The current mirror MR1 includes two N-type transistors NT. Gates of the N-type transistors NT are connected to each other, and sources of the N-type transistors NT are connected to each other. Drain and gate of one N-type transistor NT in the current mirror MR1 are connected to each other. A drain of one N-type transistor NT in the current mirror MR1 is connected to the terminal 512 of the proportional current acquisition load circuit 510P. The source of each N-type transistor NT in the current mirror MR1 is connected to the ground line LGR via a negative terminal of the bias Vb and the terminal 213.

The current mirror MR2 includes two P-type transistors PT. Gates of the P-type transistors PT are connected to each other, and sources of the P-type transistors PT are connected to each other. Drain and gate of one P-type transistor PT in the current mirror MR2 are connected. A drain of one P-type transistor PT in the current mirror MR2 is connected to a drain of the other N-type transistor NT in the current mirror MR1. The source of each P-type transistor PT in the current mirror MR2 is connected to the potential supply wiring LSU2. The drain of the other P-type transistor PT in the current mirror MR2 is connected to one end of the resistor Ro. The other end of the resistor Ro is connected to the ground line LGR via the source of each N-type transistor NT in the current mirror MR1, the negative terminal of the bias Vb, and the terminal 213.

The current sensor circuit 230P of the present embodiment connects the current mirrors MR1, MR2 to a path through which the output current IOUTP (sensor current) flows. An output voltage VOUTP1 proportional to the output current IOUTP is obtained by passing a current, which is obtained by mirroring the output current IOUTP, through the resistor Ro. In this way, by converting the output current IOUTP into the output voltage VOUTP1, the output current IOUTP can be outputted as the output voltage VOUTP1. Incidentally, in this case, the bias Vb is required in order to cancel a voltage drop that occurs in a diode-connected MOS connecting the transistor in the current mirror MR1. The transistor whose drain and gate are connected is commonly called a diode-connected MOS. The diode-connected MOS can be treated as equivalent to a voltage source when its output resistance is smaller than resistance of other circuits.

Figure 18:
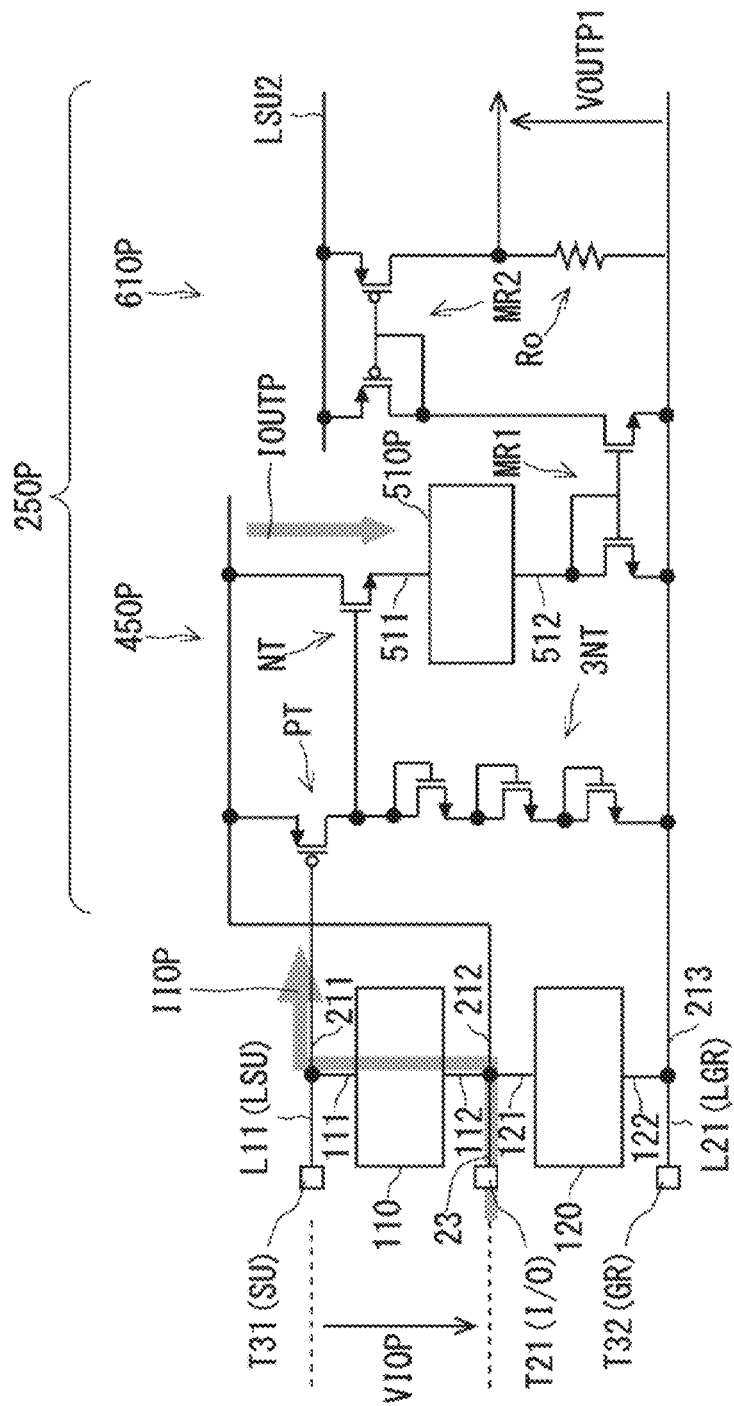
FIG. 18 is a circuit diagram illustrating another current sensor circuit in the semiconductor device according to the second embodiment.

FIG. 18 is a circuit diagram illustrating another current sensor circuit in the semiconductor device 2 according to the second embodiment. As shown in FIG. 18, another current sensor circuit 250P includes a proportional circuit 450P, a proportional current acquisition load circuit 510P, and a conversion circuit 610P. The proportional circuit 450P has a diode-connected multi-stage stack 3NT instead of the resistor Rs and the bias Vb. Specifically, instead of the resistor Rs and the bias Vb, three N-type transistors NT are connected. Gate and drain of a first N-type transistor NT are connected to the drain of the P-type transistor PT in the proportional circuit 450P. Gate and drain of a second N-type transistor are connected to a source of the first N-type transistor NT. Gate and drain of a third N-type transistor are connected to a source of the second N-type transistor NT. A source of the third N-type transistor NT is connected to the ground wiring LGR via the terminal 213.

In this way, the proportional circuit 450P in the current sensor circuit 250P generates functions of the resistor Rs and the bias Vb with the diode-connected multi-stage stack 3NT. This uses the fact that the diode-connected multi-stage stack 3NT is equivalent to the resistance Rs and the bias Vb in a linear region.

Next, described will be a case of a circuit for measuring the I/O current IION flowing from the terminal T32, which is connected to the ground wiring LGR, to the input/output terminal (terminal T21, also referred to as I/O terminal) out of circuits outputting as voltages the output currents IOUTP, IOUTN of the current sensor circuits 230P, 230N.

Figure 19:
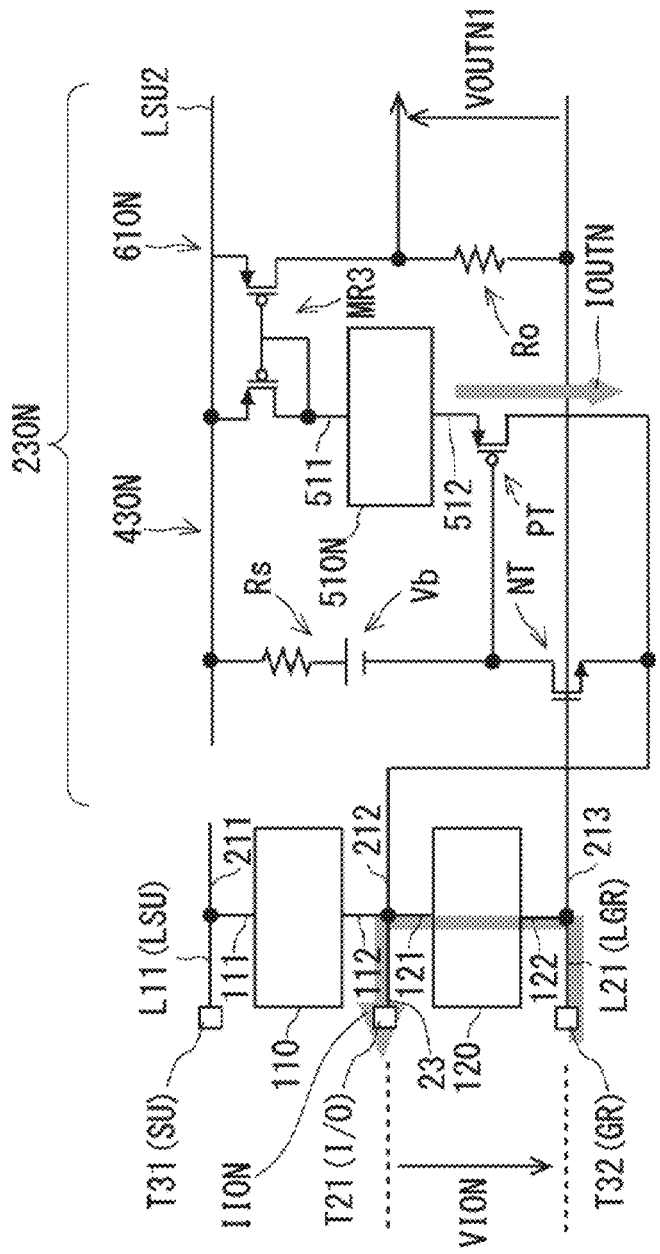
FIG. 19 is a circuit diagram illustrating a current sensor circuit in the semiconductor device according to the second embodiment.

FIG. 19 is a circuit diagram illustrating the current sensor circuit in the semiconductor device according to the second embodiment. As shown in FIG. 19, a current sensor circuit 230N includes a proportional circuit 430N, a proportional current acquisition load circuit 510N, and a conversion circuit 610N. The proportional circuit 430N includes an N-type transistor NT, a P-type transistor PT, a resistor Rs, and a bias Vb. The conversion circuit 610N includes a current mirror MR3 and a resistor Ro. The conversion circuit 610N converts an output current IOUTN of the proportional circuit 430N into an output voltage. The output current IOUTN is also called a sensor current, and the output voltage is also called a sensor voltage. The conversion circuit 610N outputs the converted output voltage to the information processing circuit 310 as output information.

A gate of the N-type transistor NT is connected to the ground wiring LGR. A source of the N-type transistor NT is connected to the terminal T21 via the terminal 212 and the signal line 23. A drain of the N-type transistor NT is connected to a negative terminal of the bias Vb and a gate of the P-type transistor PT.

A positive terminal of the bias Vb is connected to one end of the resistor Rs. The other end of the resistor Rs is connected to the potential supply wiring LSU2.

A gate of the P-type transistor PT is connected to the drain of the N-type transistor NT and the negative terminal of the bias Vb. A source of the P-type transistor PT is connected to a terminal 512 of the proportional current acquisition load circuit 510N. A drain of the P-type transistor PT is connected to the terminal T21 via the source of the N-type transistor NT and the terminal 212.

The current mirror MR3 includes two P-type transistors PT. Gates of the P-type transistors PT are connected to each other, and sources of the P-type transistors PT are connected to each other. Drain and gate of one P-type transistor PT in the current mirror MR3 are connected. A drain of one P-type transistor PT in the current mirror MR3 is connected to the terminal 511 of the proportional current acquisition load circuit 510N. A source of each P-type transistor PT in the current mirror MR3 is connected to the potential supply wiring LSU2 together with the other end of the resistor Rs. A drain of the other P-type transistor PT in the current mirror MR3 is connected to the one end of the resistor Ro. The other end of the resistor Ro is connected to the ground wiring LGR.

The current sensor circuit 230N of the present embodiment connects the current mirror MR3 to a path through which the output current IOUTN (sensor current) flows. An output voltage VOUTN1 proportional to the output current IOUTN is obtained by passing a current, which is obtained by mirroring the output current IOUTN, through the resistor Ro. In this way, by converting the output current IOUTN into the output voltage VOUTN1, the output current IOUTN can be outputted as the output voltage VOUTN1. Incidentally, in this case, the bias Vb is required in order to cancel a voltage drop occurring in the diode-connected MOS which connects the transistors in the current mirror MR3. Similarly to the above, a transistor with its drain and gate connected is commonly called a diode-connected MOS. The diode-connected MOS can be treated as equivalent to a voltage source when its output resistance is smaller in value than the resistances of other circuits.

Figure 20:
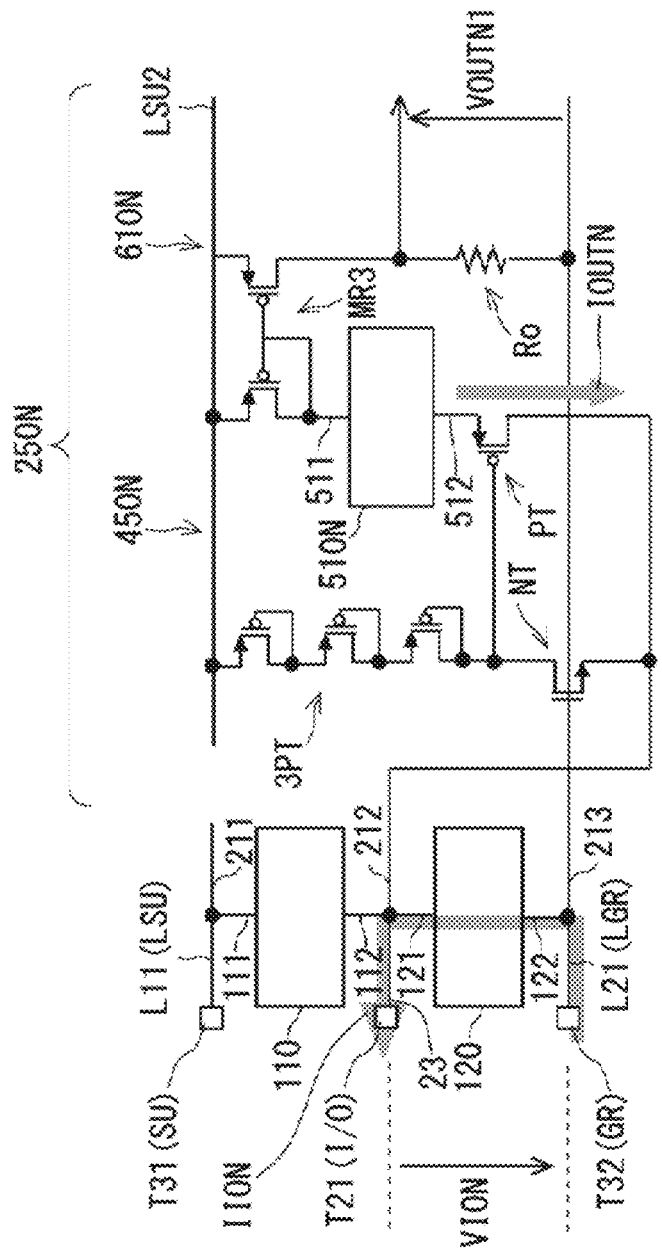
FIG. 20 is a circuit diagram illustrating another current sensor circuit in the semiconductor device according to the second embodiment.

FIG. 20 is a circuit diagram illustrating another current sensor circuit in the semiconductor device 2 according to the second embodiment. As shown in FIG. 20, another current sensor circuit 250N has a diode-connected multi-stage stack 3PT instead of the resistor Rs and the bias Vb. Specifically, instead of the resistor Rs and the bias Vb, three P-type transistors PT are connected. A source of a first P-type transistor PT is connected to the potential supply wiring LSU2. Gate and drain of the first P-type transistor PT are connected to a source of a second P-type transistor PT. Gate and drain of the second P-type transistor PT are connected to a source of a third P-type transistor PT. Gate and drain of the third P-type transistor PT are connected to the drain of the N-type transistor NT in the proportional circuit 450N and the gate of the P-type transistor PT in the proportional circuit 450N.

In this way, the current sensor circuit 250N generates the functions of the resistor Rs and the bias Vb with a diode-connected multi-stage stack 3PT. This uses the fact that the diode-connected multi-stage stack 3PT is equivalent to the resistance Rs and the bias Vb in a linear region.

Figure 21:
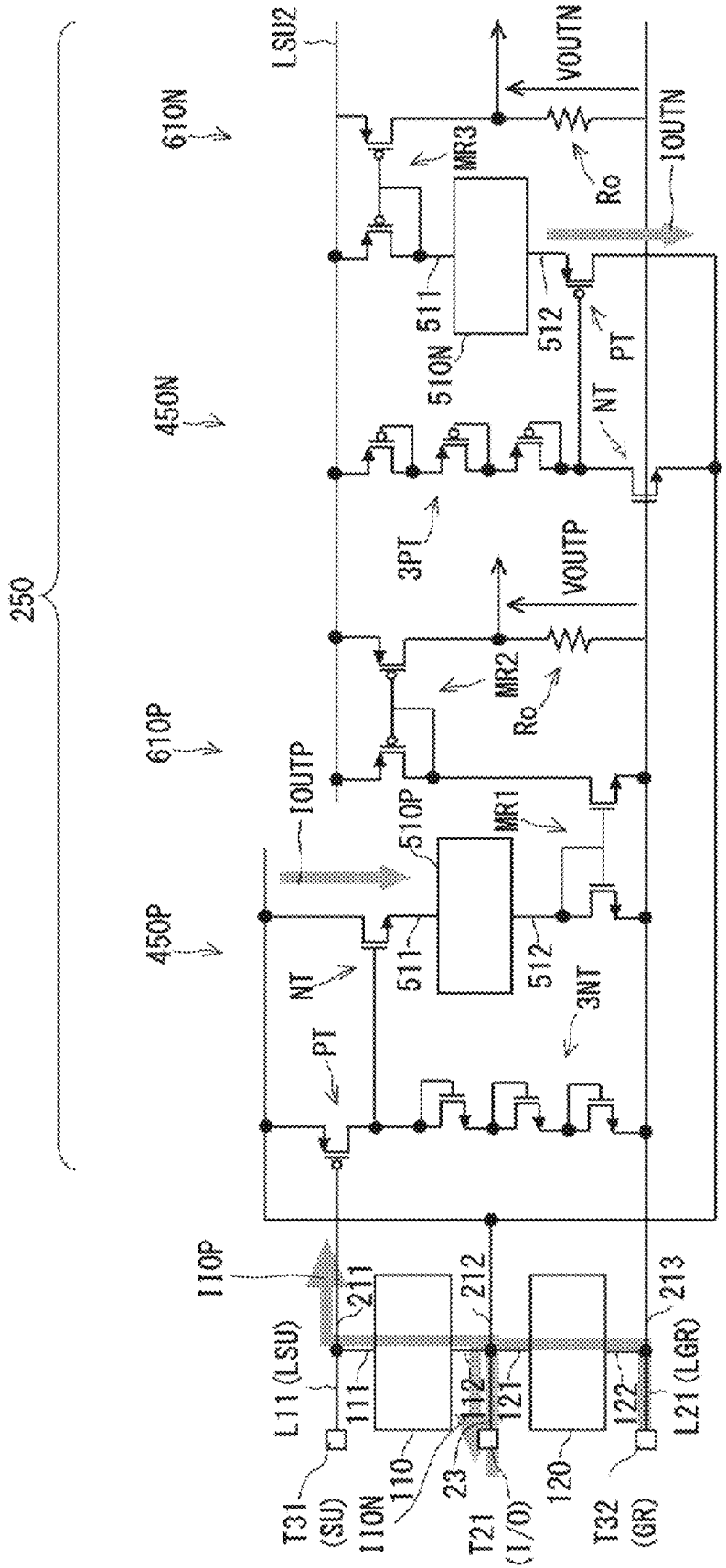
FIG. 21 is a circuit diagram illustrating an I/O current detection load circuit and a current sensor circuit in the semiconductor device according to the second embodiment.
Figure 22:
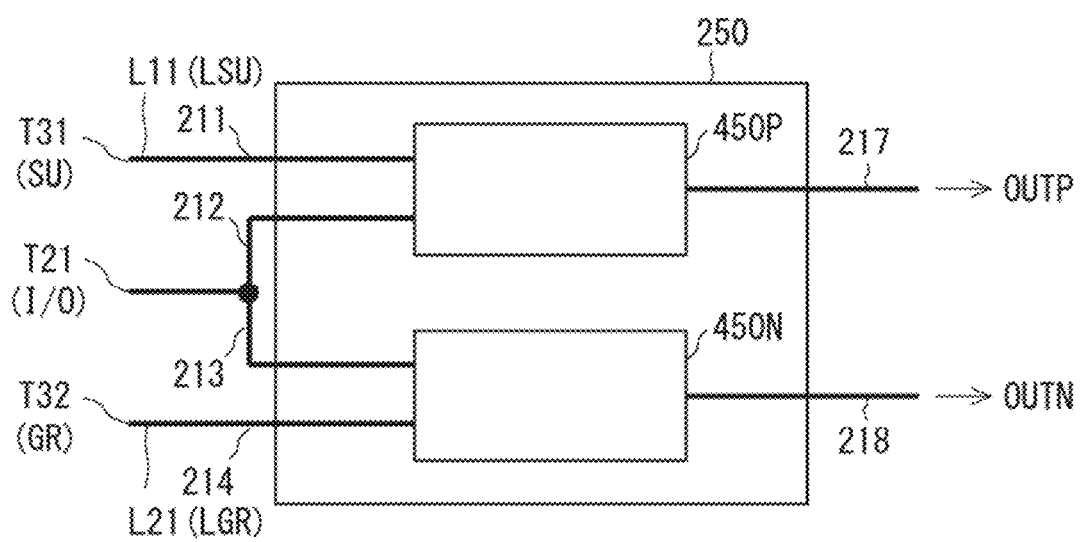
FIG. 22 is a configuration diagram illustrating a current sensor circuit in the semiconductor device according to the second embodiment.

FIG. 21 is a circuit diagram illustrating the I/O current detection load circuits 110, 120 and the current sensor circuit 250 in the semiconductor device 2 according to the second embodiment. FIG. 22 is a configuration diagram illustrating the current sensor circuit 250 in the semiconductor device 2 according to the second embodiment.

As shown in FIGS. 21 and 22, the current sensor circuit 250 may include a proportional circuit 450P and a proportional circuit 450N. The proportional circuit 450P measures a positive current IIOP flowing through the I/O current detection load circuit 110 on the potential supply line LSU side. The proportional circuit 450N measures a negative current IION flowing through the I/O current detection load circuit 120 on the ground wiring LGR side. The ground wiring LGR in the proportional circuit 450P is connected to the ground wiring LGR in the proportional circuit 450N. The potential supply wiring LSU2 in the proportional circuit 450P is connected to the potential supply wiring LSU2 in the proportional circuit 450N.

According to the semiconductor device 2 of the present embodiment, the current sensor circuit 250 can measure the positive current IIOP flowing through the I/O current detection load circuit 110 and the negative current IION flowing through the I/O current detection load circuit 120.

Third Embodiment

Next, a semiconductor device according to a third embodiment will be described. A semiconductor device of the present embodiment detects that an ESD and/or EMS current has flowed with a constant amount or more, and uses its detection signal as a trigger to prevent malfunction of the IC 20.

Figure 23:
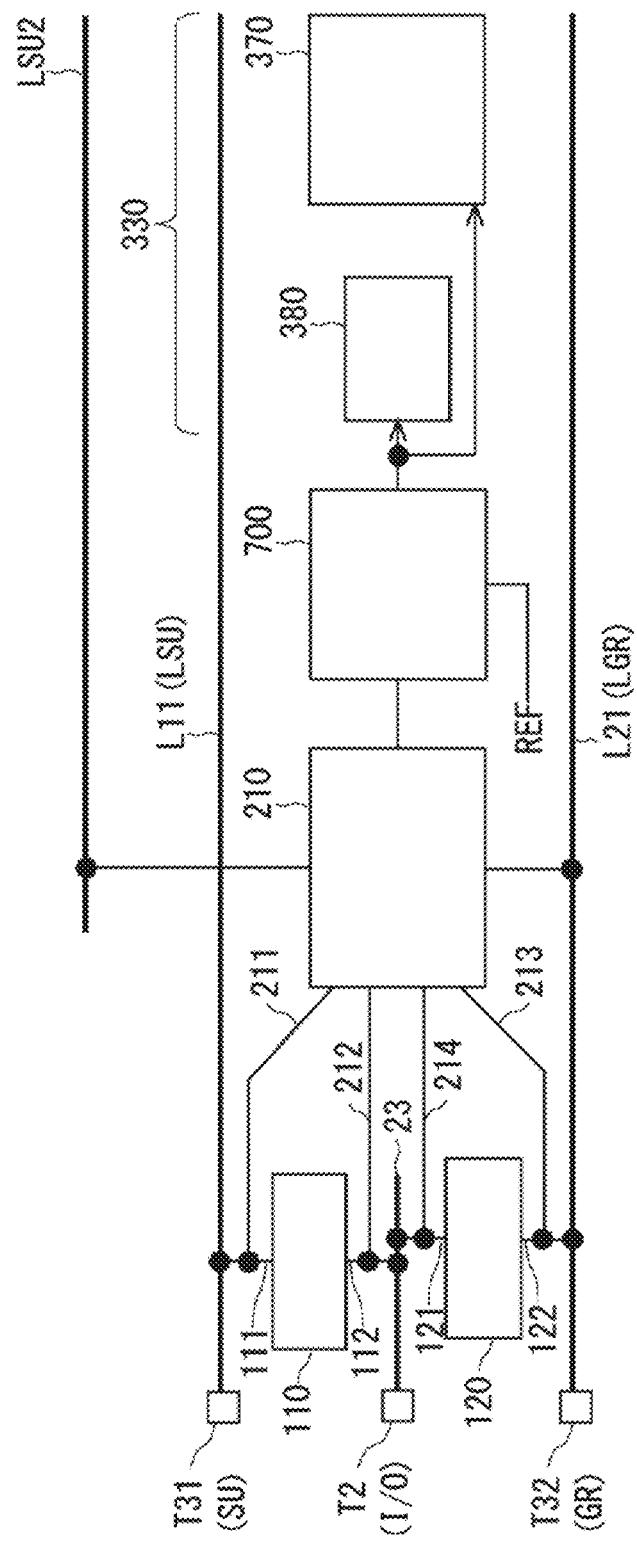
FIG. 23 is a configuration diagram illustrating a semiconductor device according to a third embodiment.

FIG. 23 is a configuration diagram illustrating the semiconductor device according to the third embodiment. As shown in FIG. 23, a semiconductor device 3 includes I/O current detection load circuits 110, 120, a current sensor circuit 210, a comparison circuit 700, and an information processing circuit 330. The information processing circuit 330 includes an IP 380 and a CPU 370, for example. The comparison circuit 700 is connected to the current sensor circuit 210. Specifically, the comparison circuit 700 is provided at a subsequent stage of the current sensor circuit 210. The comparison circuit 700 is connected to the information processing circuit 330 of the IP 380 and the CPU 370, etc.

The comparison circuit 700 makes a comparison of whether a current amount of I/O currents IIO flowing through the I/O current detection load circuits 110, 120 measured by the current sensor circuit 210 is greater than a reference value REF. The reference value REF is set in advance, for example. When the current amount is greater than the reference value REF, the comparison circuit 700 activates the following Malfunction Prevention Examples to suppress malfunction of the information processing circuit 330 of the IP 380 and the CPU 370, etc.
Malfunction Prevention Example 1. In a period in which the ESD and/or EMS current amount exceeds the reference value REF, malfunction tolerance of the information processing circuit 330 is increased. For example, the malfunction tolerance of the IP 380 in the information processing circuit 330 is increased.
Malfunction Prevention Example 2. In the period in which the ESD and/or EMS current amount exceeds the reference value REF, data handled by the information processing circuit 330 is invalidated. For example, data handled by the CPU 370 in the information processing circuit 330 is invalidated.

In this way, when the current equal to or greater than the reference value REF is inputted from the input/output terminal, the comparison circuit 700 notifies the IP 380 and the CPU 370, etc. in the information processing circuit 330 of a detection of the ESD and/or EMS current, and executes the malfunction prevention examples.

A difference between each of the above-mentioned comparative examples and the present embodiment is as follows. That is, the comparative example has a function of: storing the measured current amount in the memory circuit 360 for a long period of time; causing the CPU 370 to process the information; and thereby knowing whether there is a possibility of destruction or malfunction of the IC 20. Meanwhile, in the present embodiment, the comparison circuit 700 has a function of detecting that the measured current amount exceeds the reference value REF even temporarily, and informing the IP 380 and CPU 370, etc. in the IC 20 of the abnormality to prevent the malfunction.

If the current sensor circuit 210 of the present embodiment is not used and the current measurement accuracy is degraded, the comparative example cannot suppress the malfunction of the information processing circuit 330 of the IP 380 and the CPU 370, etc. Even if the I/O current IIO flowing through the I/O current detection load circuits 110, 120 is small, the comparative example erroneously recognizes that the large current is flowing and, therefore, that its current amount exceeds the reference value REF, thereby resulting from activating the malfunction prevention examples. Further, even when the I/O current IIO flowing through the I/O current detection load circuit 110 is large, the comparative example erroneously recognizes that only the small current is flowing and, therefore, erroneously recognizes that its current amount does not exceed the reference value REF, thereby does not activate Malfunction Prevention Examples 1 and 2. In contrast to this, in the present embodiment, by using the current sensor circuit 210, the current measurement accuracy can be improved, and the malfunction of the information processing circuit 330 of the IP 380 and the CPU 370, etc. can be suppressed.

Next, examples of the I/O current detection load circuit 110 etc. and the proportional current acquisition load circuit 510 etc. will be described. The I/O current detection load circuit 1de10 etc. and the proportional current acquisition load circuit 510 etc. include the same load circuit. Therefore, the I/O current detection load circuit 110 etc. will be described below.

Figure 24:
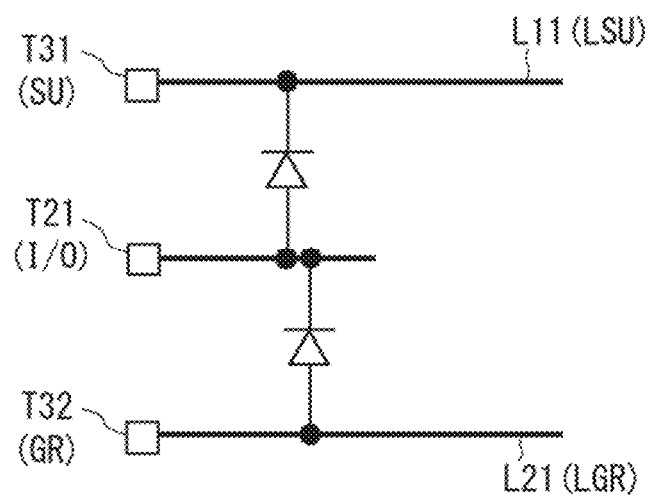
FIG. 24 is a diagram illustrating the I/O current detection load circuits in the semiconductor devices of the first to third embodiments.
Figure 25:
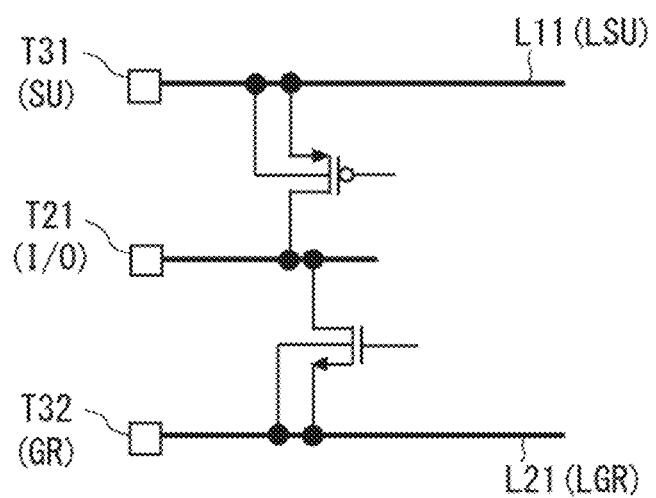
FIG. 25 is a diagram illustrating the I/O current detection load circuits in the semiconductor devices of the first to third embodiments.

FIGS. 24 and 25 are diagrams illustrating the I/O current detection load circuits 110 in the semiconductor devices of the first to third embodiments. As shown in FIG. 24, the I/O current detection load circuit 110 may include a PN junction diode. Also, as shown in FIG. 25, the I/O current detection load circuit 110 may include a MOS transistor. Thus, the I/O current detection load circuit 110 etc. and the proportional current acquisition load circuit 510 etc. may include at least one of the PN junction diode and the MOS transistor. Incidentally, if the I/O current detection load circuit 110 can detect the I/O current flowing from the input/output terminal (also referred to as I/O terminal) to the potential supply wiring LSU and/or the ground wiring LGR, some circuits other than the PN junction diode and the MOS transistor may be included. For example, they may include a bipolar transistor(s).

Figure 26:
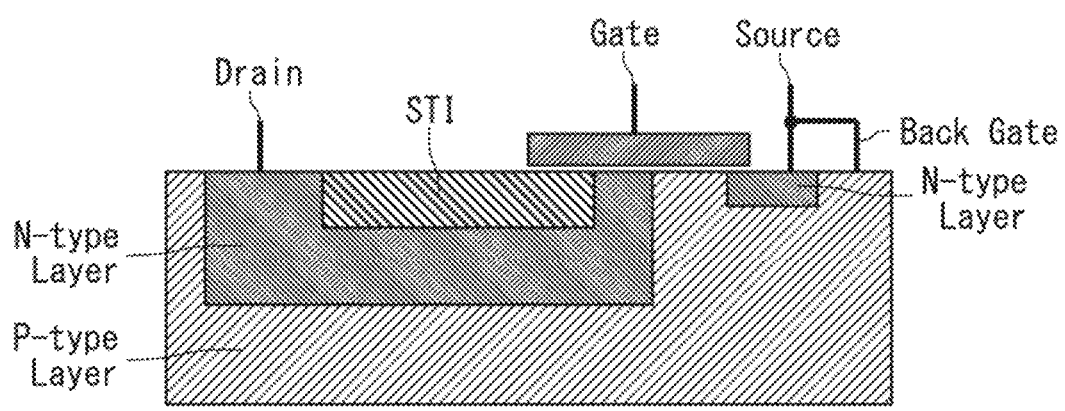
FIG. 26 is a cross-sectional view illustrating the I/O current detection load circuits in the semiconductor devices of the first to third embodiments.

Next, a structure of the above-mentioned I/O current detection load circuit 110 etc. will be described. FIGS. 26 to 31 are cross-sectional views illustrating the I/O current detection load circuits 110 in the semiconductor devices according to the first to third embodiments. As shown in FIG. 26, a MOS transistor may has: an N layer (N-type layer) that is arranged on a P layer (P-type layer) and serves as a drain (Drain); an N layer that is arranged on the P layer and serves as a drain (Drain); an STI that is arranged on the N layer and serves as the drain; a gate that covers the STI, the N layer serving as the drain, the P layer, and the N layer serving as the source; and a back gate (Back Gate) that connects the P layer and the source.

Figure 27:
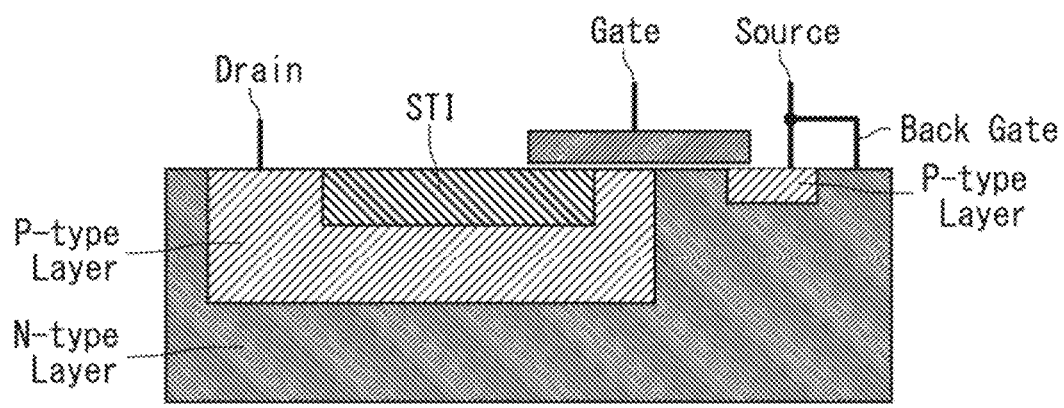
FIG. 27 is a cross-sectional view illustrating the I/O current detection load circuits in the semiconductor devices of the first to third embodiments.

Further, as shown in FIG. 27, the MOS transistor may include: a P layer which is arranged on the N layer and serves as a drain; a P layer which is arranged on the N layer and serves as a source; an STI which is arranged on the P layer and serves as a drain; a gate which covers the STI, the P layer serving as the drain, the N layer, and the P layer serving as the source; and a back gate connecting the N layer and the source.

Figure 28:
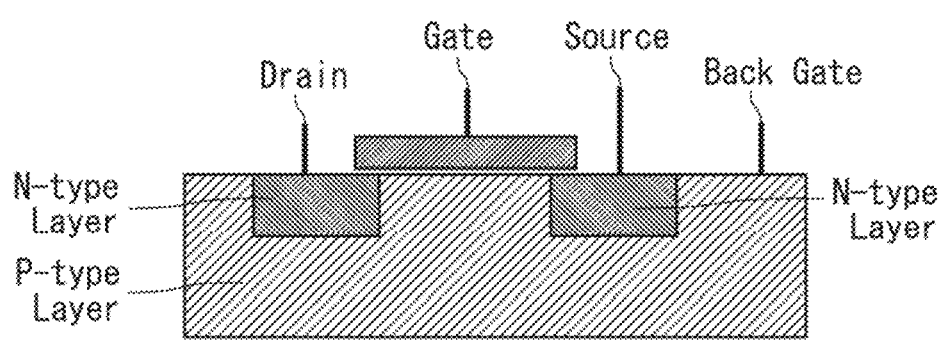
FIG. 28 is a cross-sectional view illustrating the I/O current detection load circuits in the semiconductor devices of the first to third embodiments.

Further, as shown in FIG. 28, the MOS transistor may include: an N layer which is arranged on the P layer and serves as a drain; an N layer which is arranged on the P layer and serves as a source; a gate which covers the N layer serving as the source, the N layer serving as the drain, the P layer, and the N layer serving as the source; and a back gate connected to the N layer.

Figure 29:
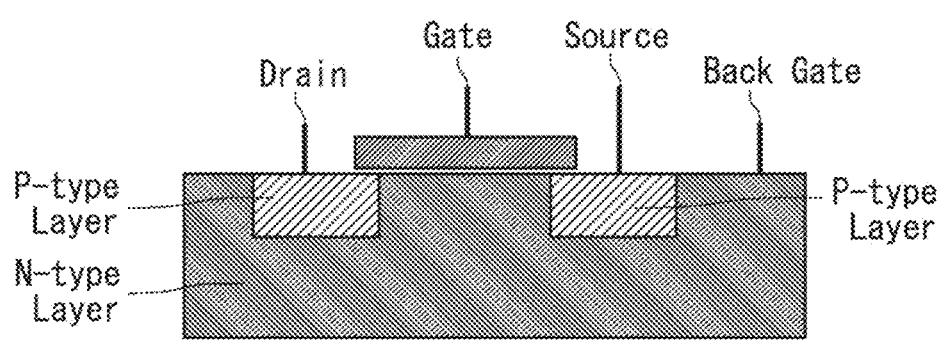
FIG. 29 is a cross-sectional view illustrating the I/O current detection load circuits in the semiconductor devices of the first to third embodiments.

Furthermore, as shown in FIG. 29, the MOS transistor may include a P layer which is arranged on an N layer and serves as a drain; a P layer which is arranged on the N layer and serves as a source; a gate which covers the P layer serving as the source, the N layer, and the P layer serving as the source; and a back gate connected to the N layer.

Figure 30:
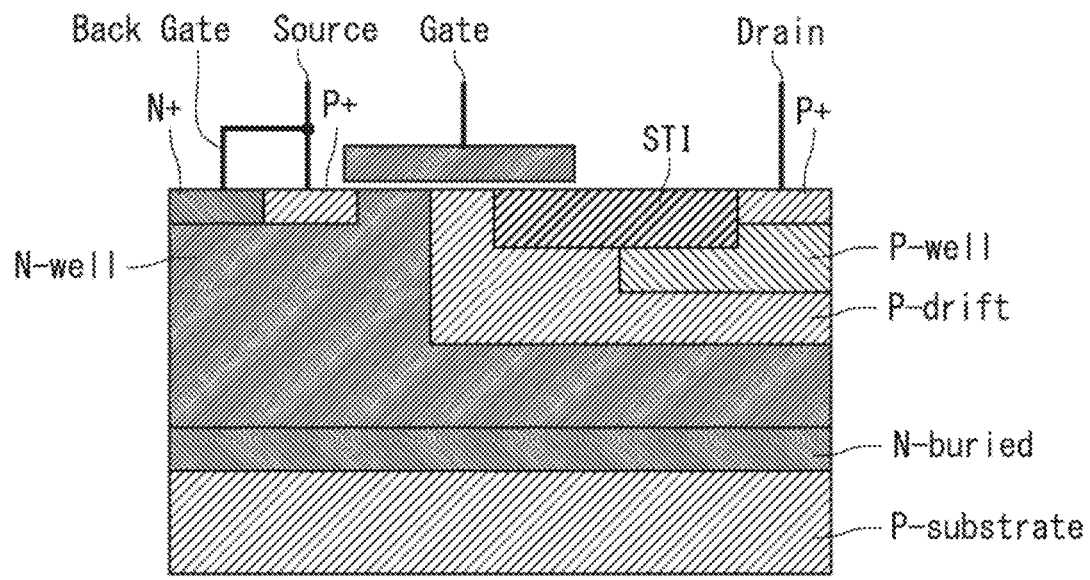
FIG. 30 is a cross-sectional view illustrating the I/O current detection load circuits in the semiconductor devices of the first to third embodiments.

As shown in FIG. 30, the MOS transistor may include: a P substrate (P-substrate); an N buried layer (N-Buried) arranged on the P substrate; an N well (N-well) arranged on the N buried layer; a P+ layer that is arranged on the N well and serves as a source; an N+ layer that is arranged adjacent to the P+ layer serving as the source on the N well; a P drift layer (P-drift) that is arranged on the N well; a P well (P-well) arranged on the P drift layer; an STI arranged on the P drift layer and the P well so as to be in contact with the P drift layer and the P well; a P+ layer arranged on the P drift layer and the P well so as to be adjacent to the STI on the P well; a gate (Gate) covering the P+ layer serving as the source, the N well, the P drift layer, and the STI; and a back gate that connects the P+ layer serving as the source and the N+ layer.

Figure 31:
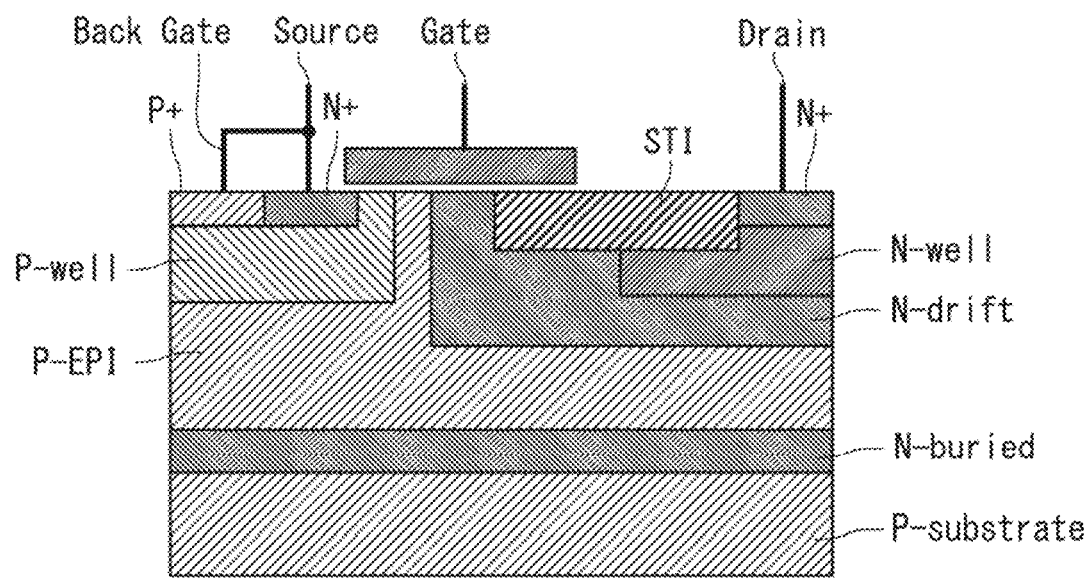
FIG. 31 is a cross-sectional view illustrating the I/O current detection load circuits in the semiconductor devices of the first to third embodiments.

In addition, as shown in FIG. 31, the MOS transistor may include: a P substrate; an N buried layer arranged on the P substrate; a P epi layer (P-EPI) arranged on the N buried layer; a P well arranged on the P epi layer; an N+ layer which is arranged on the P well and serves a source; a P+ layer which is arranged adjacent to the N+ layer serving as the source on the P well; an N drift layer (N-drift) arranged on the P epi layer; an N well arranged on the N drift layer; an STI arranged on the N drift layer and the N well so as to be in contact with the N drift layer and the N well; an N+ layer arranged on N drift layer and the N well so as to be adjacent to the N drift layer and the N well; a gate covering the N+ layer serving as the source, the P well, the P epi layer, the N drift layer, and the STI; and a back gate connecting the N+ layer serving as the source and the P+ layer.

The I/O current detection load circuit 110 and the like may include the MOS transistors as shown in FIGS. 26 to 31. The N layer (N-type Layer, N-buried, N-well, N-drift, N+, etc.) refers to an N-type diffusion layer, and the P layer (P-type Layer, P-substrate, P-drift, P-well, P-EPI, P+, etc.) refers to a P-type diffusion layer. Regardless of what kind of impurity is mixed and what kind of impurity concentration is present, a layer corresponding to a P-type diffusion layer is defined as a P-layer, and a layer corresponding to an N-type diffusion layer is defined as an N-layer.

As shown in FIGS. 26, 28, and 31, in a case of an N-type MOS transistor, the N layer is electrically connected to the drain (Drain), and the P layer is electrically connected to the back gate (Back Gate). A parasitic diode in which the P layer and the N layer are coupled exists between the back gate and the drain.

As shown in FIGS. 27, 29, and 30, in a case of a P-type MOS transistor, the P layer is electrically connected to the drain, and the N layer is electrically connected to the back gate. A parasitic diode in which the P layer and the N layer are coupled is present between the drain and the back gate. Therefore, the above-mentioned diode includes at least one of the PN junction diode and the parasitic diode generated between the drain and back gate of the MOS transistor. In FIG. 25, the P-type MOS transistor as shown in FIGS. 27, 29 and 30 is present between the T31 and the T21, and the N-type MOS transistor as shown in FIGS. 26, 38, and 31 is present between the T21 and the T32. However, the present embodiment is not limited to those cases. the N-type MOS transistor may be used between the T31 and the T21, and the P-type MOS transistor may be used between the T21 and the T32.

The I/O current detection load circuit 110 etc. and the proportional current acquisition load circuit 510 etc. are diodes, and the diodes have the same cross-sectional structure. Here, the same cross-sectional structure means that cross-sectional structures are the same as those as shown in FIGS. 26 to 31. In other words, the same cross-sectional structure means that some differences included in normal distributions such as manufacturing variation and process variation are within the same cross-sectional structure. Further, the same cross-sectional structure means that the cross-sectional structure is the same even if respective sizes of the P layer, the N layer, and the STI are different. Moreover, the same cross-sectional structure means that the cross-sectional structure is the same even if positions of respective terminals of the drain, gate, source, and back gate are different.

As described above, the invention made by the present inventor has been specifically described based on the embodiment, but the present invention is not limited to the above-mentioned embodiment and, needless to say, can be variously modified within a range not departing from the scope of the invention. Further, a combination of the respective configurations of the first to third embodiments is also within the scope of the technical idea.

Note 21

In the semiconductor device according to note 19, the first proportional current acquisition load circuit has the same size as the first I/O current detection load circuit or a smaller size than the first I/O current detection load circuit, and the second proportional current acquisition load circuit is the same size as the second I/O current detection load circuit or a smaller size than the second I/O current detection load circuit.

Note 22

In the semiconductor device according to note 19, the first current sensor circuit further has a first conversion circuit that converts the first sensor current into a first sensor voltage, the second current sensor circuit further has a second conversion circuit that converts the second sensor current into a second sensor voltage, the first conversion circuit outputs the converted first sensor voltage as the first output information, and the second conversion circuit outputs the converted second sensor voltage as the second output information.

Note 23

In the semiconductor device according to note 22, each of the first conversion circuit and the second conversion circuit includes a current mirror circuit and a resistor.

Note 24

In the semiconductor device according to note 23, each of the first proportional circuit and the second proportional circuit includes a transistor, a resistor and a bias.

Note 25

In the semiconductor device according to note 23, each of the first proportional circuit and the second proportional circuit includes a transistor and a diode-connected multi-stage stack of the transistor.

Note 26

The semiconductor device according to note 19 further includes a comparison circuit that compares the first sensor current and the second sensor current with a reference value, in which the comparison circuit increases malfunction tolerance of the information processing circuit when at least one of the first sensor current and the second sensor current is greater than the reference value.

Note 27

The semiconductor device according to note 19 further includes a comparison circuit that compares the first sensor current and the second sensor current with a reference value, in which the comparison circuit invalidates data handled by the information processing circuit when at least one of the first sensor current and the second sensor current is greater than the reference value.

Note 28

In the semiconductor device according to note 19, each of the first I/O current detection load circuit and first proportional current acquisition load circuit, and the second I/O current detection load circuit and second proportional current acquisition load circuit includes at least of one of a PN junction diode, a bipolar transistor, and a MOS transistor.

What is claimed is:
1. A semiconductor device comprising:
a potential supply terminal to which a potential is supplied;
an I/O terminal for exchanging a signal with an external device;
an I/O current detection load circuit electrically connected to the potential supply terminal and the I/O terminal; and
a current sensor circuit detecting an I/O current flowing through the I/O current detection load circuit,
wherein the current sensor circuit generates a sensor current proportional to the I/O current, and outputs the sensor current as output information, and
wherein the I/O current is an abnormal current flowing through the I/O terminal due to at least one of electrostatic discharge and electromagnetic susceptibility, and is a current greater than such a predetermined current as to become an abnormal state wherein when the I/O current flows through the I/O current detection load circuit, the I/O current detection load circuit generates an input voltage between a terminal into which the I/O current of the I/O current detection load circuit flows and a terminal from which the I/O current of the I/O current detection load circuit flows, and
wherein the I/O current detection load circuit has a first coefficient that is a ratio of the I/O current to the input voltage, the first coefficient being not constant with respect to the I/O current, and the I/O current and the input voltage being not proportional.

2. The semiconductor device according to claim 1,
wherein the current sensor circuit has a proportional circuit and a proportional current acquisition load circuit electrically connected to the proportional circuit,
wherein the proportional circuit has the input voltage as an input, outputs as an output voltage a voltage obtained by multiplying the input voltage by approximately a single multiple, causes the proportional current acquisition load circuit to input the output voltage, and passes the sensor current through the proportional current acquisition load circuit,
wherein the proportional current acquisition load circuit inputs the output voltage between a terminal into which the sensor current flows and a terminal from which the sensor current flows,
wherein the proportional current acquisition load circuit has a second coefficient that is a ratio of the sensor current to the output voltage, a ratio of the first coefficient to the second coefficient being approximately a single multiple and equivalent,
wherein the I/O current is a product of the first coefficient and the input voltage, the sensor current is a product of the second coefficient and the output voltage, the input voltage and the output voltage are equivalent since a ratio of the sensor current to the output voltage is approximately a single multiple, and the first coefficient and the second coefficient are equivalent since the ratio of the first coefficient to the second coefficient is approximately a single multiple, and
wherein the I/O current can be replaced by the product of the second coefficient and the output voltage, and the sensor current can be replaced by the product of the first coefficient and the input voltage, a ratio of the I/O current and the sensor current becomes approximately a single multiple, and the I/O current and the sensor current are proportional.

3. The semiconductor device according to claim 2,
wherein the I/O current detection load circuit and the proportional current acquisition load circuit are diodes, the diodes having the same cross-sectional structure, and
wherein each of the diodes includes at least one of a PN junction diode and a parasitic diode generated between a drain and a back gate of a MOS transistor.

4. The semiconductor device according to claim 2,
wherein the proportional circuit includes a transistor and a resistor.

5. The semiconductor device according to claim 2,
wherein the proportional current acquisition load circuit has the same size as the I/O current detection load circuit or a smaller size than the I/O current detection load circuit.

6. The semiconductor device according to claim 2,
wherein the current sensor circuit further has a conversion circuit that converts the sensor current into a sensor voltage, and
wherein the conversion circuit outputs the converted sensor voltage as the output information.

7. The semiconductor device according to claim 6,
wherein the conversion circuit includes a current mirror and a resistor.

8. The semiconductor device according to claim 7,
wherein the proportional circuit includes a transistor, a resistor, and a bias.

9. The semiconductor device according to claim 7,
wherein the proportional circuit includes a transistor and a diode-connected multi-stage stack of the transistor.

10. The semiconductor device according to claim 2,
wherein each of the I/O current detection load circuit and the proportional current acquisition load circuit includes at least one of a PN junction diode, a bipolar transistor, and a MOS transistor.

11. The semiconductor device according to claim 1,
wherein the current sensor circuit has a proportional circuit and a proportional current acquisition load circuit electrically connected to the proportional circuit,
wherein the proportional circuit has the input voltage as an input, outputs as an output voltage a voltage obtained by multiplying the input voltage by approximately a single multiple, causes the proportional current acquisition load circuit to input the output voltage, and passes the sensor current through the proportional current acquisition load circuit,
wherein the proportional current acquisition load circuit inputs the output voltage between a terminal into which the sensor current flows and a terminal from which the sensor current flows,
wherein the proportional current acquisition load circuit has a second coefficient that is a ratio of the sensor current to the output voltage, a ratio of the first coefficient to the second coefficient being approximately a constant multiple,
wherein the I/O current is a product of the first coefficient and the input voltage, the sensor current is a product of the second coefficient and the output voltage, the input voltage and the output voltage are equivalent since the ratio of the input current to the output voltage is approximately a single multiple, and the first coefficient and the second coefficient are proportional since the ratio of the first coefficient to the second coefficient is approximately a constant multiple, and
wherein the I/O current is proportional to the product of the second coefficient and the output voltage, the sensor current is proportional to the product of the first coefficient and the input voltage, and the I/O current and the sensor current is proportional.

12. The semiconductor device according to claim 11,
wherein the I/O current detection load circuit and the proportional current acquisition load circuit are diodes, the diodes having the same cross-sectional structure, and
wherein each of the diodes includes at least one of a PN junction diode and a parasitic diode generated between a drain and a back gate of a MOS transistor.

13. The semiconductor device according to claim 1, further comprising an information processing circuit electrically connected to the current sensor circuit and processing the output information outputted from the current sensor circuit.

14. The semiconductor device according to claim 13,
wherein the information processing circuit outputs an abnormal signal indicating that the abnormal current has flowed through at least one of the potential supply terminal and the I/O terminal when the output information exceeds a predetermined threshold.

15. The semiconductor device according to claim 13, further comprising a comparison circuit comparing the sensor current to a reference value,
wherein the comparison circuit increases malfunction tolerance of the information processing circuit when the sensor current is greater than the reference value.

16. The semiconductor device according to claim 13, further comprising a comparison circuit comparing the sensor current to a reference value,
wherein the comparison circuit invalidates data handled by the information processing circuit when the sensor current is greater than the reference value.

17. The semiconductor device according to claim 1,
wherein the potential is a power supply potential or a ground potential.

18. A semiconductor device comprising:
a first potential supply terminal to which a first potential is supplied;
an I/O terminal for exchanging a signal with an external device;
a first I/O current detection load circuit electrically connected to the first potential supply terminal and the I/O terminal;
a first current sensor circuit detecting a first I/O current that flows through the first I/O current detection load circuit;
a second potential supply terminal to which a second potential different from the first potential is supplied;
a second I/O current detection load circuit electrically connected to the second potential supply terminal and the I/O terminal; and
a second current sensor circuit detecting a second I/O current flowing through the second I/O current detection load circuit,
wherein the first current sensor circuit generates a first sensor current proportional to the first I/O current, and outputs the first sensor current as first output information,
wherein the second current sensor circuit generates a second sensor current proportional to the second I/O current, and outputs the second sensor current as second output information, and
wherein at least one of the first I/O current and the second I/O current is an abnormal current that flows through the I/O terminal due to at least one of electrostatic discharge and electromagnetic susceptibility, and is a current greater than such a predetermined current as to become an abnormal state.

19. The semiconductor device according to claim 18, further comprising an information processing circuit electrically connected to the first current sensor circuit and the second current sensor circuit and processing at least one of the first output information and the second output information.

* * * * *